(12) United States Patent
Merry et al.

(10) Patent No.: US 11,749,540 B2
(45) Date of Patent: Sep. 5, 2023

(54) DUAL ACTUATING TILTING SLIT VALVE

(71) Applicant: APPLIED MATERIALS, INC., Santa Clara, CA (US)

(72) Inventors: Nir Merry, Mountain View, CA (US); Jeff Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 266 days.

(21) Appl. No.: 16/999,248

(22) Filed: Aug. 21, 2020

(65) Prior Publication Data

US 2022/0059373 A1 Feb. 24, 2022

(51) Int. Cl.
*H01L 21/67* (2006.01)
*F16K 31/524* (2006.01)
*F16K 11/052* (2006.01)

(52) U.S. Cl.
CPC ...... *H01L 21/67126* (2013.01); *F16K 11/052* (2013.01); *F16K 31/52416* (2013.01); *F16K 31/52441* (2013.01)

(58) Field of Classification Search
CPC ............ H01L 21/67126; F16K 11/052; F16K 31/52441; F16K 31/02; F16K 31/52416
USPC ......................................... 251/302, 327, 301
See application file for complete search history.

(56) References Cited

U.S. PATENT DOCUMENTS

| 6,601,824 | B2 | 8/2003 | Kroeker | |
| 6,966,538 | B2* | 11/2005 | Hayashi | F16K 51/02 251/327 |
| 7,059,583 | B2 | 6/2006 | Tomasch | |
| 7,198,251 | B2* | 4/2007 | Kondoh | F16K 51/02 251/193 |
| 2008/0237513 | A1* | 10/2008 | Kim | F16K 3/184 251/62 |
| 2017/0037977 | A1* | 2/2017 | Surprenant | F16K 3/18 |
| 2019/0011061 | A1* | 1/2019 | Kim | F16K 3/02 |

\* cited by examiner

*Primary Examiner* — Craig J Price
*Assistant Examiner* — Andrew J Rost
(74) *Attorney, Agent, or Firm* — Lowenstein Sandler LLP

(57) ABSTRACT

Disclosed is a wafer processing system, a dual gate system, and methods for operating these systems. The dual gate system may have a shaft, a first gate and a second gate coupled to the shaft at opposite sides thereof, and an actuator coupled to the shaft. The actuator is configured to tilt together the shaft, the first gate, and the second gate to a first sealed gate position or to a second sealed gate position. The actuator can be operated using a pneumatic mechanism, an electro-magnetic mechanism, or a cam follower mechanism.

12 Claims, 7 Drawing Sheets

DUAL ACTUATING TILTING SLIT VALVE

FIELD OF THE DISCLOSURE

Embodiments of the present disclosure relate generally to methods and systems for processing wafers. More specifically, the present disclosure relates to a dual actuating tilting slit valve.

BACKGROUND OF THE DISCLOSURE

In electronic device manufacturing, wafers (e.g., silicon-containing wafers, silicon-containing plates) may be moved about manufacturing facilities and within manufacturing equipment tools, for example from a factory interface to a load lock chamber, from a load lock chamber to a transfer chamber, from a transfer chamber to a processing chamber, and the like.

The processing chambers used in electronic device manufacturing perform substrate processing operations such as etching, chemical vapor deposition or physical vapor deposition, and the like. Such substrate processing operations expose the gates that are used to seal the processing chambers to corrosive environments. The corrosive environment corrodes the gates, lending them to regular servicing and maintenance.

Conventionally, when a gate that is used to seal a processing chamber is due to be replaced or serviced, the transfer chamber and the processing chamber are both vented, the gate that separates the processing chamber from the transfer chamber is replaced or serviced, followed by the transfer chamber and the processing chamber both being pumped down to vacuum again. During such gate servicing, the entire electronic device manufacturing system is down for an extended duration.

As an alternative, ports that house two gates that can be used alternately are positioned between adjacent chambers (such as between a processing chamber and a transfer chamber). In this manner, one gate is used to isolate one chamber from the other (e.g., the transfer chamber from the processing chamber) while the other gate is serviced. This alternative gets away from halting processing in the entire electronic device manufacturing system during servicing/maintenance.

In ports that house two gates, each gate is typically coupled to its designated actuator for actuating/manipulating its corresponding gate. Individual actuators for each gate take up additional space, use additional grease, require individual maintenance, and generate additional contamination as compared to a single actuator that actuates/manipulates both gates.

Furthermore, existing actuators manipulate the motion of their corresponding gate at a steady speed and/or with disregard to the intermittent position of the gate during its motion from one end position to another end position. As such, the gate may reach a hard stop (e.g., upon reaching an end position such as a closed position or an open position) at its highest velocity. This may contribute to undesirable vibrations, particle generation, and wafer defects.

SUMMARY OF THE DISCLOSURE

In certain embodiments, the instant disclosure is directed to a dual gate system that includes a first gate, a second gate, and a shaft coupled to the first gate, to the second gate, and to a tilting mechanism. The first gate is configured to form a first seal against a first slot on a first side of the dual gate system that couples to a first chamber of an electronics device processing system. The second gate is configured to form a second seal against a second slot on a second side of the dual gate system that couples to a second chamber of the electronics device processing system. The second side of the dual gate system is opposite the first side of the dual gate system. The first gate is coupled to a first side of the shaft and the second gate is coupled to a second side of the shaft. The tilting mechanism is configured to seal the first gate to the first slot by tilting together, about a pivot point, the shaft, the first gate, and the second gate to a first sealed gate position where the first gate is compressed against the first side of the dual gate system. The tilting mechanism is further configured to seal the second gate to the second slot by tilting together, about the pivot point, the shaft, the first gate, and the second gate to a second sealed gate position where the second gate is compressed against the second side of the dual gate system. The tilting mechanism is further configured to control at least one of a velocity or force of the shaft, the first gate, and the second gate.

In certain embodiments, the instant disclosure is directed to a method for operating a dual gate system. The method includes controlling an actuator to tilt together, about a pivot point and in a first direction, at a controlled velocity and/or force, a shaft, a first gate coupled to a first side of the shaft, and a second gate coupled to a second side of the shaft, to a first sealed gate position. The first sealed gate position includes a first seal of the first gate against a first slot on a first side of the dual gate system that couples to a first chamber of an electronics device processing system. The method further includes controlling the actuator to tilt together, about the pivot point and in a second direction, at the controlled velocity and/or force, the shaft, the first gate, and the second gate, to a second sealed gate position. The second sealed gate position includes a second seal of the second gate against a second slot on a second side of the dual gate system that couples to a second chamber of an electronics device processing system. The velocity and/or force are controlled via a tilting mechanism.

In certain embodiments, the instant disclosure is directed to a dual gate system that includes a first gate, a second gate, and a shaft coupled to the first gate, to the second gate, and to a sealing mechanism. The first gate is configured to form a first seal against a first slot on a first side of the dual gate system that couples to a first chamber of an electronics device processing system. The second gate is configured to form a second seal against a second slot on a second side of the dual gate system that couples to a second chamber of the electronics device processing system. The second side of the dual gate system is opposite the first side of the dual gate system. The first gate is coupled to a first side of the shaft and the second gate is coupled to a second side of the shaft. The sealing mechanism includes a first cam follower track, a second cam follower track, a cam follower track switch, and a controller. The first cam follower track is configured to seal the first gate to the first slot by moving together the shaft, the first gate, and the second gate along the first cam follower track to a first sealed gate position. The second cam follower track is configured to seal the second gate to the second slot by moving together the shaft, the first gate, and the second gate along the second cam follower track to a second sealed gate position. The cam follower track switch is configured to switch between the first cam follower track and the second cam follower track. The controller is configured to control at least one of a velocity or a force of the shaft, the first gate, and the second gate.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
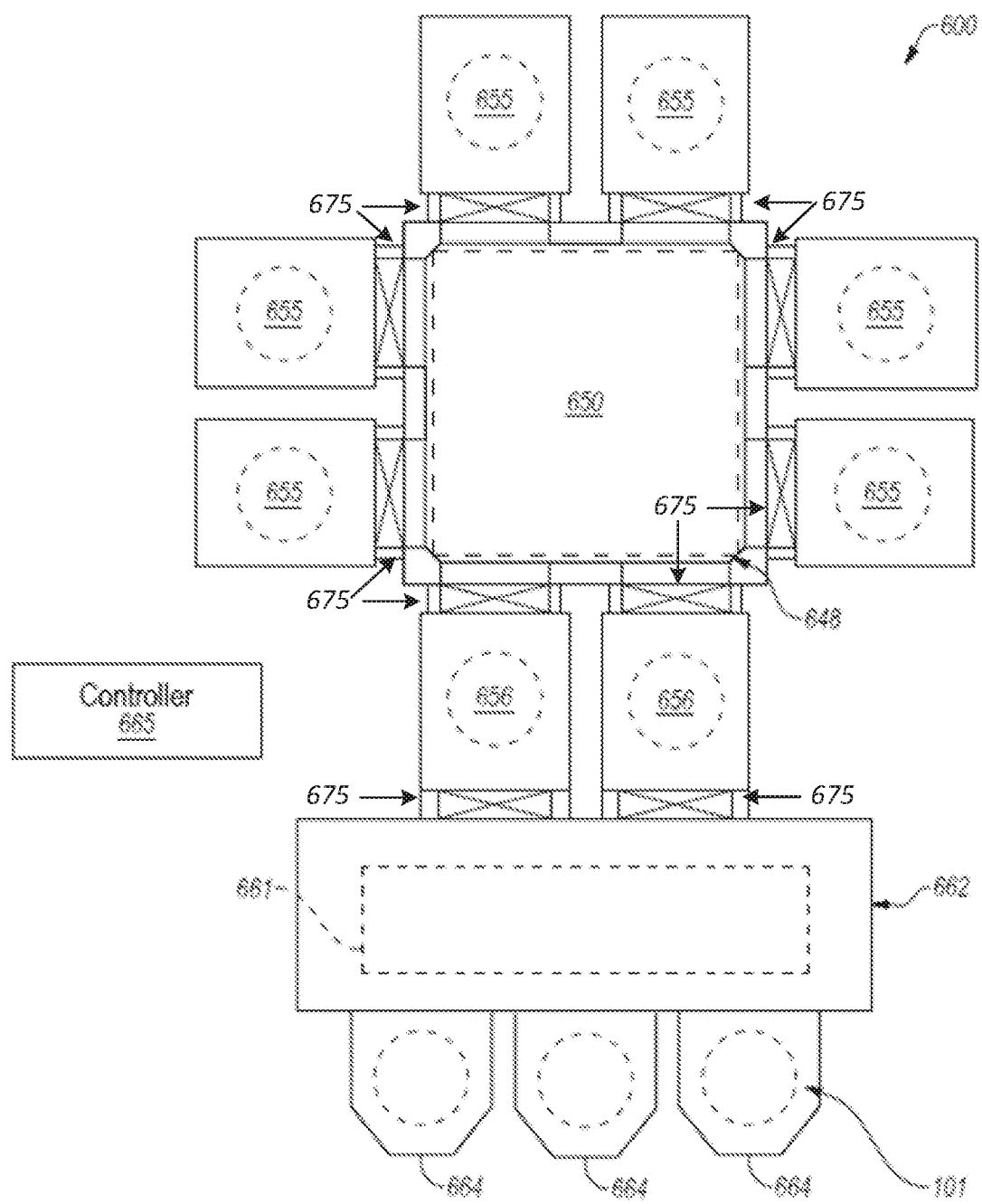
FIG. 1 illustrates a top schematic of a wafer processing system in accordance with embodiments of the present disclosure.

During wafer processing, wafers and/or other objects are transferred between multiple chambers, for example from a factory interface into a load lock chamber, from a load lock chamber into a transfer chamber, and from a transfer chamber to a processing chamber, to name a few. During such transfers, wafers are moved through ports that are positioned between adjacent chambers. The ports typically house one or two slit valves (also referred to here as "gates") at least one of which is closed during wafer processing to isolate adjacent chambers from each other and are opened during wafer and/or other object transfers from one chamber to another.

After a certain number of hours of operation or in accordance with a servicing schedule (e.g., monthly), one or more gates may be due for replacement, servicing, or maintenance. When a single gate is used to isolate one chamber from another, the entire wafer processing system is vented to service said gate, resulting in extended downtime and lost wafer processing hours. To minimize downtime, dual gate systems are often used to isolate adjacent chambers. With a dual gate system, one gate can be serviced, while the other gate can continue isolating adjacent chambers without impacting processing (or with minimal impact to wafer processing).

Dual gate type set ups include, in certain embodiments, one gate that is used continuously or more frequently (e.g., a gate sealing against the main frame) and a second gate that is a maintenance gate and is used more rarely. The gate that is used continuously and more frequently also tends to be subjected to more frequent maintenance. A dual gate system, according to embodiments described herein, allows utilization of both gates in a manner that maximizes the time between maintenance on the continuous use gate. Furthermore, the maintenance gate can be managed so that it is serviced or maintained at a lesser interval that corresponds to chamber servicing or maintenance (which involves venting and opening the chamber).

In certain dual gate systems, each gate is coupled to its designated actuator for manipulating the corresponding gate towards its corresponding sealed gate position. A design that includes a single actuator for manipulating both gates to their corresponding sealed gate position, rather than utilizing separate actuators to accomplish this, may beneficially reduce the size and thickness of the ports used between chambers, reduce the amount of grease used and the contamination that is associated with such use (from the grease or from particle formation), and increase reliability due to operation of a reduced number of tools.

A wafer processing system (also referred to here as "electronic device processing system"), a dual gate system operated by a variety of actuators, and an operational method thereof are described herein. Note that while wafer processing systems are described, embodiments herein also apply to other electronics device processing systems (e.g., such as those that operate on displays), which may process substrates other than wafers. In certain embodiments, the wafer processing system includes a first chamber and a second chamber adjacent to the first chamber. The wafer processing system may further include a port positioned between the first chamber and the second chamber.

The port may include a housing and a dual gate system housed within the housing. The housing may have a first side coupled to a first chamber and a second side coupled to a second chamber. The second side is opposite the first side. The first side may further include a first slot and the second side may further include a second slot, wherein objects are transferrable between the first chamber and the second chamber through the port via the first slot and the second slot.

The dual gate system may include a first gate, a second gate, a shaft, and a tilting mechanism and/or a sealing mechanism. The first gate and the second gate may be coupled to the shaft on opposite sides of the shaft and may both be removable. The first gate may be configured to form a first seal against the first slot upon orthogonal contact between the first gate and the first side. The second gate may be configured to form a second seal against the second slot upon orthogonal contact between the second gate and the second side. Each gate and/or each corresponding side may be at an angle (relative to a vertical direction) that provides for an orthogonal contact between each gate and its corresponding side.

The tilting mechanism and/or sealing mechanism is coupled to the shaft and is configured to provide horizontal motion actuation to the shaft. A portion of the shaft may be coupled to a pivot point, which causes the horizontal motion actuation to become a tilting motion for the shaft, the first gate, and the second gate. In another embodiment, the tilting mechanism and/or sealing mechanism is configured to provide vertical motion actuation to the shaft. A cam follower mechanism may then cause the vertical actuation to translate into a tilting motion. In both cases, the actuation and tilting motion causes the first gate and second gate to reach, at a controlled velocity and/or force, a first sealed gate position, a second sealed gate position, or an intermediate open gate position. The tilting mechanism can be pneumatic where a proportional pneumatic valve may be controlled to control the velocity and/or force of the motion of the combined unit of the shaft, the first gate, and the second gate. The tilting mechanism can be electro-magnetic where one or more electro-magnets may be controlled to control the velocity and/or force of the motion of the combined unit of the shaft, the first gate, and the second gate. The sealing mechanism can include a cam follower mechanism including two cam follower tracks and a cam follower track switch. Motion along two cam follower tracks can be controlled to control the velocity and/or force of the motion of the combined unit of the shaft, the first gate, and the second gate.

The shaft may further be coupled to a vertical actuation mechanism configured to provide vertical motion actuation to the combined unit of the shaft, the first gate, and the second gate upwards or downwards (e.g., between an intermediate open position and an open gate position). The vertical actuation mechanism may be decoupled from the horizontal motion actuation.

One advantage of the dual gate systems described in embodiments herein over conventional dual gate systems is that they provide real time in-situ knowledge of the whereabouts of the gates throughout the full motion (i.e., as the gate moves from one end position to another end position) and real time in-situ ability to adjust the motion profile of the gates throughout the full motion. This advantage may be used to control at least one of velocity and/or force of the combined unit of the shaft, first gate, and second gate on an as-needed basis in order to accelerate the combined unit, decelerate the combined unit, pause the combined unit, or have the combined unit exert additional force in the closed position and/or less force while approaching the closed position, depending on the combined unit's position within the full motion and/or depending on how close the combined unit's motion profile is to the commanded position trajectory for the combined unit.

For instance, upon the combined unit approaching an end position (e.g., an intermediate open gate position, a first sealed gate position, or a second sealed gate position), the force exerted on the combined unit may be controlled to allow the combined unit to decelerate and pause upon reaching its end position. In this manner, the combined unit will reach its end position with a clean and easy stop rather than a hard stop that may contribute to wear, system vibration, particle generation, and wafer defects, as is presently observed with existing dual gate systems where the gate tends to reach its end position when it moves in its highest velocity (bringing about a hard stop, particle generation, and system vibration).

In certain embodiments, upon the combined unit initiating movement from a certain end position (e.g., from an intermediate open gate position towards a first sealed gate position or a second sealed gate position, and the like), the force exerted on the combined unit may be controlled to allow the combined unit to accelerate.

In certain embodiments, upon the combined unit being in a first sealed gate position or in a second sealed gate position (i.e., where the gate is isolating one chamber from an adjacent chamber), the force exerted on the combined unit may be controlled to allow the combined unit to increase the force exerted on the seal so that the gate is better able to isolate two adjacent chambers from one another despite a pressure differential between the two adjacent chambers. The force exerted on the combined unit may be controlled to ease the force exerted by the combined unit on the seal as the pressure differential between the two adjacent chambers decreases.

As used herein, the singular forms "a," "an," and "the" include plural references unless the context clearly indicates otherwise. Thus, for example, reference to "a wafer" includes a single wafer as well as two or more wafers, and the like.

As used herein, the term "about" in connection with a measured quantity, refers to the normal variations in that measured quantity, as expected by one of ordinary skill in the art in making the measurement and exercising a level of care commensurate with the objective of measurement and the precision of the measuring equipment. In certain embodiments, the term "about" includes the recited number ±10%, such that "about 10" would include from 9 to 11.

As used herein, the term "vertically" in connection with a movement direction refers to movement upward and/or downward along a Z axis depicted in FIGS. 2A-2D.

As used herein, the term "horizontally" in connection with a movement direction refers to movement sideways, such as to the right or to the left, along an X axis depicted in FIGS. 2A-2D.

As used herein, the term "station" and term "chamber" may be used interchangeably and may refer to a chamber in which objects transferred through a wafer processing system, such as a wafers, may be stored temporarily. A station, as used herein, may be separated from other portions of the wafer processing system with at least one gate. Examples of stations include a front opening unified pod (FOUP), a load lock, a load port, a process chamber, a transfer chamber, and a factory interface.

The phrase "intermediate open gate position" may be used interchangeably with the phrase "non-tilted gate position" and refers to the combined unit of a shaft, a first gate, and a second gate being in an intermediate location along the X axis between the first sealed gate position and the second sealed gate position. This intermediate location along the X axis may be (but is not necessarily) midway between the first sealed gate position and the second sealed gate position. In the intermediate open gate position, the combined unit of the shaft, first gate, and second gate are in an upward location along the Z axis and may be actuated vertically downward (e.g., via a vertical motion actuation mechanism) to reach an open gate position where objects (such as wafers) can be transferred between adjacent chambers through a first slot and a second slot. An exemplary intermediate open gate position is depicted and described with respect to FIG. 2A.

The phrase "wafer processing system" and "electronic devices processing system" are used interchangeably herein.

The term "gate" and "slit valve" are used interchangeably herein.

The phrase "combined unit" are used herein to refer to the shaft, the first gate coupled to a first side of the shaft, and the second gate coupled to a second side of the shaft.

Reference to control of velocity refers to controlling the tilt velocity of the shaft in certain embodiments and/or to controlling the motion velocity of the shaft along a cam follower track in other embodiments.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to illuminate certain materials and methods and does not pose a limitation on scope. No language in the specification should be construed as indicating any non-claimed element as essential to the practice of the disclosed materials and methods.

FIG. 1 illustrates a top schematic of a wafer processing system 600 in accordance with embodiments of the present disclosure. Wafer processing system 600 may include a factory interface 662 (also referred to as "equipment front end module (EFEM)"), a main frame 648 (also referred to as a transfer chamber), one or more processing chambers 655, and one or more load lock chambers 656 according to embodiments described herein. Main frame 648 may be connected to factory interface 662 via the one or more load lock chambers 656. Wafer carriers 664 may be detachably connected to a front wall of the factory interface 662. Factory interface 662 may include a factory interface robot 661 for moving wafer 101 (shown dotted for illustration purposes) and/or other objects (such as process kit ring, etc.) between wafer carriers 664 and load lock chambers 656. For instance, factory interface 662 may include one or more load ports, each of which may receive a wafer carrier 664. An overhead track (OHT) may drop a front opening unified pod (FOUP) onto a load port. Factory interface robot 661 may pick wafer 101 from the FOUP and may optionally align wafer 101 in an aligner (not shown). Subsequently, factory interface robot 661 may place wafer 101 in load lock chamber 656. Thereafter, main frame robot 650 (located in main frame 648) may pick wafer 101 from at least one of load lock chambers 656 and hand wafer 101 to at least one of the one or more processing chambers 655.

As the manufacturing processes progress, the factory interface robot 661 and the main frame robot 650, working in tandem, move wafers 101 and/or other objects between the wafer carriers 664 and the processing chambers 655. Various electronic device fabrication processes, e.g., semiconductor device manufacturing processes, such as, e.g., oxidation, thin film deposition, etching, heat treatment, degassing, cool down, etc., may take place within process chambers 655.

After processing in at least one of the one or more processing chambers 655 is complete, processed wafer 101 may be picked by main frame robot 650 and handed over to at least one of load lock chambers 656. At least one of load lock chambers 656 may pump its pressure up to atmospheric pressure followed by the processed wafer 101 being picked by the factory interface robot 661 and placed back into the FOUP. After all wafers from wafer carriers 664 are processed, the OHT (not shown) may pick the FOUP and drop it with a different tool as per the designed manufacturing process.

Wafer 101 and/or other objects are transferred between one station to an adjacent station (e.g., between transfer chamber 648 to processing chamber 655, between load lock chamber 656 and transfer chamber 648, between factory interface 662 and load lock chamber 656, and the like) via dual gate systems in embodiments, described in further detail with respect to FIGS. 2A-2D, that are housed in ports 675.

Various constituents of wafer processing system 600 and their operations may be controlled by a wafer processing system controller 665. For example, the controller 665 may receive signals and send commands to main frame robot 650, the factory interface robot 661, receive and process sensing data from various sensors (such as continuous position sensor), control initiation and cessation of processing, control wafer transfer, control actuation mechanisms that manipulate the gates between adjacent chambers (e.g., between transfer chamber 648 to processing chamber 655, between load lock chamber 656 and transfer chamber 648, between factory interface 662 and load lock chamber 656, and the like), and/or other processing components of processing system 600.

The controller 665 may be and/or include a computing device such as a personal computer, a server computer, a programmable logic controller (PLC), a microcontroller, and so on. The controller 665 may include (or be) one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. The controller 665 may include a data storage device (e.g., one or more disk drives and/or solid state drives), a main memory, a static memory, a network interface, and/or other components. The controller 665 may execute instructions to perform any one or more of the methodologies and/or embodiments described herein. The instructions may be stored on a computer readable storage medium, which may include the main memory, static memory, secondary storage and/or processing device (during execution of the instructions).

In some wafer processing systems, a single gate may separate two adjacent stations rather than two gates. One of the downsides to a single gate separating two adjacent stations is that when that gate is due for servicing and/or maintenance, the entire system is vented and opened to service and/or maintain the gate. Thus, hours of productivity of the wafer processing system are lost during servicing and/or maintenance. Additionally, exposure of the interior of the stations may cause contamination of the interior that may be followed by a long requalification and/or long re-equilibration process for each station and for the wafer processing system after the gate has been serviced and the stations are closed again. In contrast, two gate systems enable servicing of one gate (and optionally the station that is proximate to that gate), while the other gate can continue to isolate the adjacent station and/or the remainder of the wafer processing systems from the outside environment. In this manner, after servicing of one of the gates is complete, a smaller portion of the wafer processing systems may be subjected to requalification and/or re-equilibration and less processing hours are lost due to system downtime.

Some ports between two adjacent stations may include a housing that encompasses a dual gate system (which can include a dual actuator system). Dual gate systems that include dual actuator systems may include a first gate coupled to a first actuator that is configured to move the first gate from an open position to a first sealed gate position and a separate second gate coupled to a second actuator (separate from the first actuator) that is configured to move the second gate from an open position to a second sealed gate position. In this configuration, each actuator, manipulates its designated gate. Such dual actuator system may be decoupled from a separate vertical motion actuation mechanism. Thus, in certain instances, conventional dual gate systems use more than two actuators to move the relevant constituents of the dual gate system to one closed position or to another closed position.

Having two (or more) actuators with each manipulating a single gate, as opposed to having a single actuator that could manipulate both gates, takes up more space, uses up more grease, generates more contamination, and involves more maintenance. Accordingly, some ports in wafer processing system 600 of FIG. 1 include dual gate systems actuated by a single actuator. The instant disclosure is directed in certain embodiments to a dual gate system in which a single actuator manipulates two gates. Such embodiments beneficially reduce the number of actuators used, reduce the amount of grease used, reduce the amount of contamination associated with operating two (or more) actuators as opposed to one (e.g., number of particles generated by two actuators as opposed to one, the amount of grease used by two actuators as opposed to one), increase reliability, and reduce space uptake since one actuator takes less space than a single actuator.

Figure 2A:
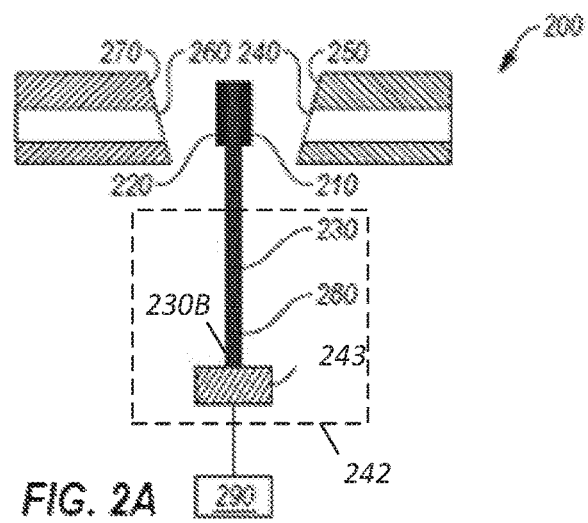
FIG. 2A illustrates a simplified cross-sectional side view of a dual gate system in an intermediate open gate position in accordance with embodiments of the present disclosure.

FIG. 2A illustrates a simplified side view of a dual gate system in accordance with embodiments of the present disclosure. As shown in FIG. 2A, the dual gate system 200, housed in port 675, according to embodiments, includes a first gate 210, a second gate 220, a shaft 230, and a tilting mechanism 242. The shaft 230 is coupled to the first gate 210, to the second gate 220, and to the tilting mechanism 242. As shown in FIG. 2, the first gate 210 is coupled to a first side of the shaft 230 at a first end 230T of the shaft 230 and the second gate 220 is coupled to a second side of the shaft 230 at the first end 230T of the shaft 230. The first side of the shaft 230 may be opposite the second side of the shaft 230 such that the first gate 210 and the second gate 220 are coupled to opposite sides of the shaft 230.

The first gate is configured to form a first seal against a first slot 240 on a first side 250 of the dual gate system that couples to a first chamber (or a first station) of an electronics device processing system (or wafer processing system). The second gate is configured to form a second seal against a second slot 260 on a second side 270 of the dual gate system that couples to a second chamber (or a second station) of an electronics device processing system (or wafer processing system). In certain embodiments, the second side 270 is opposite the first side 250 and the second slot 260 is opposite the first slot 240.

A variety of tilting mechanisms may be utilized to create a tilting movement to move the dual gate system in a first direction towards a first sealed gate position, in a second direction towards a second sealed gate position, or in either the first direction or in the second direction towards an intermediate open gate position. In certain embodiments, the tilting mechanism 242 includes an actuator 243 (e.g., a horizontal actuator) coupled to a second end 230B of the shaft 230 that is opposite the first end 230T of the 230 and a pivot point 280 coupled to the shaft 230 at a point somewhere between the first end 230T and the second end 230B of the shaft 230. The actuator 243 may be a horizontal actuator that moves a bottom (e.g., second end 230B) of the shaft in a first direction away from the first side 250 and towards the second side 270, or in a second direction away from the second side 270 and towards the first side 250. This may cause the shaft to pivot about the pivot point 280 such that the top (e.g., first end 230T) of the shaft moves in an opposite direction via a tilting motion. For example, if the second end 230B of the shaft is moved towards the second side 270, then the first end 230T of the shaft (including the first gate 210 and second gate 220) moves towards the first side 250. Similarly, if the second end 230B of the shaft is moved towards the first side 250, then the first end 230T of the shaft moves towards the second side 270.

Figure 2B:
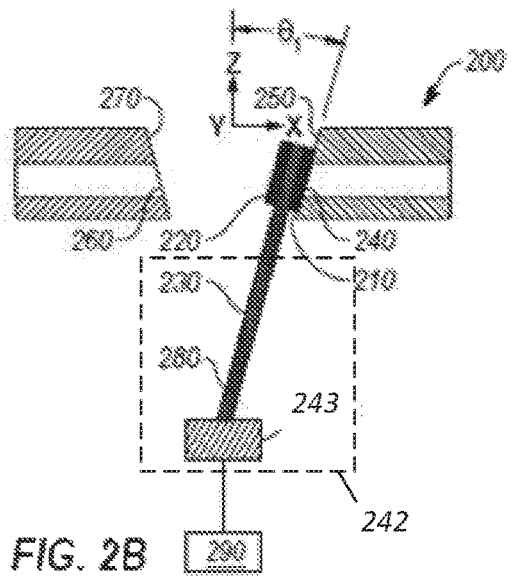
FIG. 2B illustrates a simplified cross-sectional side view of a dual gate system in a first sealed gate position in accordance with embodiments of the present disclosure.

In certain embodiments, the tilting mechanism 242 is configured to seal the first gate 210 to the first slot 240 by tilting together, about pivot point 280, the shaft 230, the first gate 210, and the second gate 220 to a first sealed gate position (described in further detail with respect to FIG. 2B). In certain embodiments, the tilting mechanism 242 is configured to seal the second gate 220 to the second slot 260 by tilting together, about pivot point 280, the shaft 230, the first gate 210, and the second gate 220 to a second sealed gate position (described in further detail with respect to FIG. 2C). In certain embodiments, the tilting mechanism 242 is configured to open the first slot 240 and the second slot 260 by tilting together, about the pivot point 280, the shaft 230, the first gate 210, and the second gate 220 to an intermediate open gate position (illustrated in FIG. 2A) from the first sealed gate position or from the second sealed gate position.

In the first sealed gate position, as shown in FIG. 2B, the first gate 210 is compressed against the first side 250. In certain embodiments, there is at least one o-ring (not shown) on the first gate 210 and/or on the first side 250. When the first gate 210 is compressed against the first side 250, the at least one o-ring on the first gate 210 and/or on the first side 250 is compressed between the first gate 210 and the first side 250.

Figure 2C:
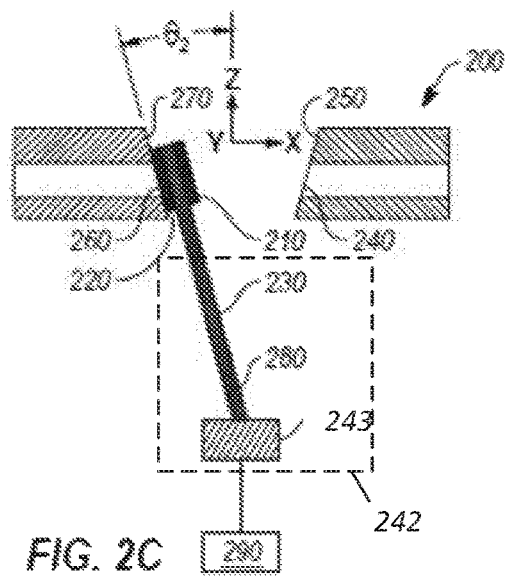
FIG. 2C illustrates a simplified cross-sectional side view of a dual gate system in a second sealed gate position in accordance with embodiments of the present disclosure.

In the second sealed gate position, as shown in FIG. 2C, the second gate 220 is compressed against the second side 270. In certain embodiments, there is at least one o-ring (not shown) on the second gate 220 and/or on the second side 270. When the second gate 220 is compressed against the second side 260, the at least one o-ring on the second gate 220 and/or on the second side 270 is compressed between the second gate 220 and the second side 270.

Figure 2D:
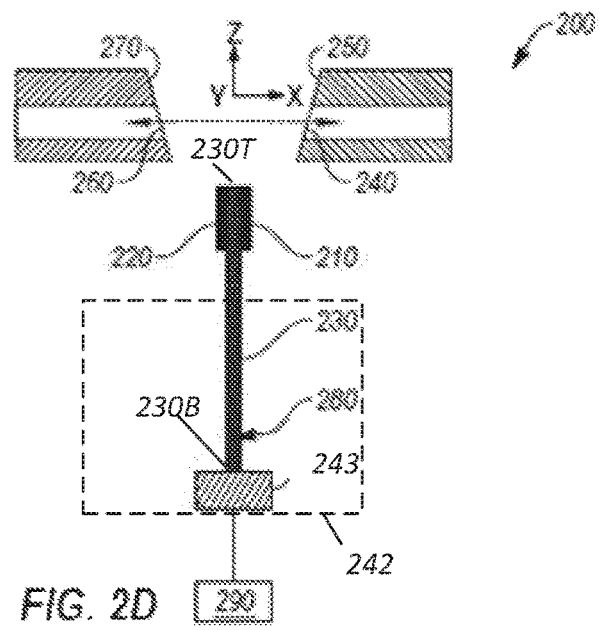
FIG. 2D illustrates a simplified cross-sectional side view of a dual gate system in an open gate position in accordance with embodiments of the present disclosure.

In the open gate position, as shown in FIG. 2D, the shaft 230, the first gate 210, and the second gate 220 are positioned in an intermediate location, along the horizontal axis (designated as X in FIG. 2D), between the first side 250 and the second side 270, and at a downward location, along the vertical axis (designated as Z in FIG. 2D). The horizontal motion actuation mechanisms that will be described in further detail with respect to subsequent figures is configured to move together the shaft 230, the first gate 210, and the second gate 220 to the intermediate location, along the horizontal axis (designated as X in FIG. 2D) to reach an intermediate open position (shown in FIG. 2A) where the shaft 230, the first gate 210, and the second gate 220 may be in a non-tilted position. At the intermediate location, a vertical motion actuation mechanism 290, which the shaft 230 may also be coupled to, is configured to move together, the shaft 230, the first gate 210, and the second gate 220 vertically downward to the open gate position depicted in FIG. 2D. The vertical motion actuation mechanism 290 is also configured to move together, the shaft 230, the first gate 210, and the second gate 220 vertically upwards from the open gate position depicted in FIG. 2D to an intermediate open position (depicted in FIG. 2A) prior to tilting the shaft 230, the first gate 210, and the second gate 220 to either direction. At the open gate position depicted in FIG. 2D, objects may be transferred from one station to an adjacent station through first slot 240 and second slot 260.

Returning back to FIG. 2A, the tilting mechanism 242 of the dual gate system 200 is further configured to control at least one of a velocity or a force of the shaft 230, the first gate 210, and the second gate 220. In certain embodiments, the tilting mechanism 242 includes a continuous position sensor configured to provide real time measurements indicative of the position of the shaft 230, the first gate 210, and the second gate 220. In certain embodiments, the tilting mechanism 242 is also coupled to a controller (e.g., 665) that is configured to receive a pre-set commanded position trajectory for the shaft 230, the first gate 210, and the second gate 220 and a position measurement of the shaft 230, the first gate 210, and the second gate 220. Then, based on the position measurements relative to a pre-set commanded position trajectory and the particular tilting mechanism that is being utilized, a control signal may be generated and transmitted, by the controller (e.g., 665) to the tilting mechanism, in order to cause operation of the tilting mechanism. In this manner, the controller is configured to control (i.e., reduce, increase, or maintain) at least one the velocity or force of the shaft 230, the first gate 210, and the second gate 220 during its horizontal and/or vertical motion.

The controller (e.g., 665) may include configuration information indicating a length of the shaft above the pivot point, a length of the shaft below the pivot point, locations on the shaft of the first gate 210 and the second gate 220, and a location near the second end of the shaft 230B at which the actuator connects to the shaft. This information may be used to translate linear motion of the actuator into tilting motion of the first gate 210 and second gate 220. In one embodiment, the controller includes a table that indicates, for each position of the actuator, a corresponding position of the first gate 210 and/or second gate 220. The position measurement mechanism measures a position of the actuator (and bottom end 230B of the shaft) in embodiments. The configuration information (e.g., table translating actuator position to gate position) may then be used to accurately determine positions of the first and second gates. This information may also be used to compute velocity and/or acceleration (e.g., radial velocity and/or acceleration) of the gates based on the changes in position of the actuator over time.

One advantage of the tilting mechanism described in embodiments herein over conventional horizontal and/or vertical motion actuation mechanisms is that it provides real time in-situ knowledge of the whereabouts of the gate throughout the full motion (i.e., as the gate moves from one end position to another end position) and real time in-situ ability to adjust the motion profile of the gate throughout the full motion. This advantage may be used to adjust the velocity and/or force of the shaft 230, the first gate 210, and the second gate 220 on an as-needed basis depending on the gate's position within the full motion and/or depending on how close the gate's motion profile is to the pre-set commanded position trajectory for the gate.

For instance, upon the gate approaching an end position (e.g., an intermediate open position (FIG. 2A) or a closed position (FIGS. 2B or 2C)), at least one of the force or velocity of the shaft 230, the first gate 210, and the second gate 220 may be adjusted so as to decelerate the combined unit and pause the combined unit upon the combined unit reaching its end position. In this manner, the combined unit will reach its end position with a clean and easy stop rather than a hard stop that may contribute to wear, system vibration, particle generation, and wafer defects, as is presently observed with existing slit valve control mechanisms where the gate tends to reach its end position when it moves in its highest velocity (bringing about a hard stop, particle generation, and system vibration).

In certain embodiments, upon the combined unit initiating movement from an end position (e.g., an intermediate open position (FIG. 2A) or a closed position (FIGS. 2B or 2C)) towards another end position (e.g., from an open intermediate position towards a closed position or from a closed position towards an open intermediate position), at least one of the force or velocity of the combined unit may be adjusted so as to accelerate the combined unit.

In certain embodiments, upon the combined unit being in a closed position (i.e., where the gate is sealed against a slot and isolating one chamber from an adjacent chamber (FIGS. 2B or 2C)), the force of the combined unit against the first side 250 (FIG. 2B) or against the second side 260 (FIG. 2C) may be increased so that the combined unit is able to isolate the two adjacent chambers from one another despite a pressure differential between the two adjacent chambers. The force exerted by the combined unit against the first side 250 (FIG. 2B) or against the second side 260 (FIG. 2C) may be eased up as the pressure differential between the two adjacent chambers decreases.

In certain embodiments, at least one of the first gate 210 or the second gate 220 is removable from the shaft 230. In one embodiment, the first gate 210 and the second gate 220 are both removable from the shaft 230. The combined unit of the shaft 230, the first gate 210, and the second gate 220 may be compact in dimension while still providing sufficient room for an operator and/or a robot to readily access the port 675 and remove at least one of the first gate 210 or the second gate 220 (or to place at least one of the first gate 210 or the second gate 220 after it has been replaced and/or cleaned and/or serviced).

Each of the first gate 210 and the second gate 220 may be coupled to the shaft in a manner such that the contact of each of the gates with the corresponding side and slot/opening of a chamber (i.e., the first gate 210 with the first side 250 or the second gate 220 with the second side 270) is orthogonal. In an example, all points of the first gate 210 may contact first side 250 simultaneously with a force that is perpendicular to the surface of the first side 250. In another example, all points of the second gate 220 may contact second side 270 simultaneously with a force that is perpendicular to the surface of the second side 270. Orthogonal contact between the gate and its corresponding side upon their contacting reduces friction and shear. This reduces wear of the sealing interface on the gate and on the side that the gate contacts in the closed position. This also reduces the number of particles generated from the sealing interface.

In certain embodiments, at least a portion of the first side 250 to which the first gate 210 makes contact is at a first angle $\theta_1$ to vertical (the vertical being designated by Z) such that the first gate 210 orthogonally contacts the portion of the first side 250 upon tilting to the first sealed gate position to seal the first slot 240 (as shown in FIG. 2B). In certain embodiments, the first angle $\theta_1$ is about 1° to about 20°, about 3° to about 18°, about 5° to about 15°, about 8° to about 12°, or any sub-range therein, with all angles being measured to vertical in the first direction.

In certain embodiments, at least a portion of the second side 270 to which the second gate 220 makes contact is at a second angle $\theta_2$ to vertical (the vertical being designated by Z) such that the second gate 220 orthogonally contacts the portion of the second side 270 upon tilting to the second sealed gate position to seal the second slot 260 (as shown in FIG. 2C). In certain embodiments, the second angle $\theta_2$ is about 1° to about 20°, about 3° to about 18°, about 5° to about 15°, about 8° to about 12°, or any sub-range therein, with all angles being measured to vertical in the second direction.

A variety of actuation mechanisms may be utilized to create tilting movement (which includes a horizontal component and a vertical components) of the dual gate systems described herein, such as, without limitations, a pneumatic actuation mechanism (FIG. 3), an electromagnetic actuation mechanism (FIG. 4), a cam follower actuation mechanism (FIGS. 6A-6C), and the like. Various actuation mechanisms for creating tilting movement of the dual gate system will be described in further detail with respect to subsequent figures. Any of the dual gate systems described herein may be further coupled to a vertical actuation mechanism utilized to create vertical movement of the dual gate systems described herein.

Figure 3:
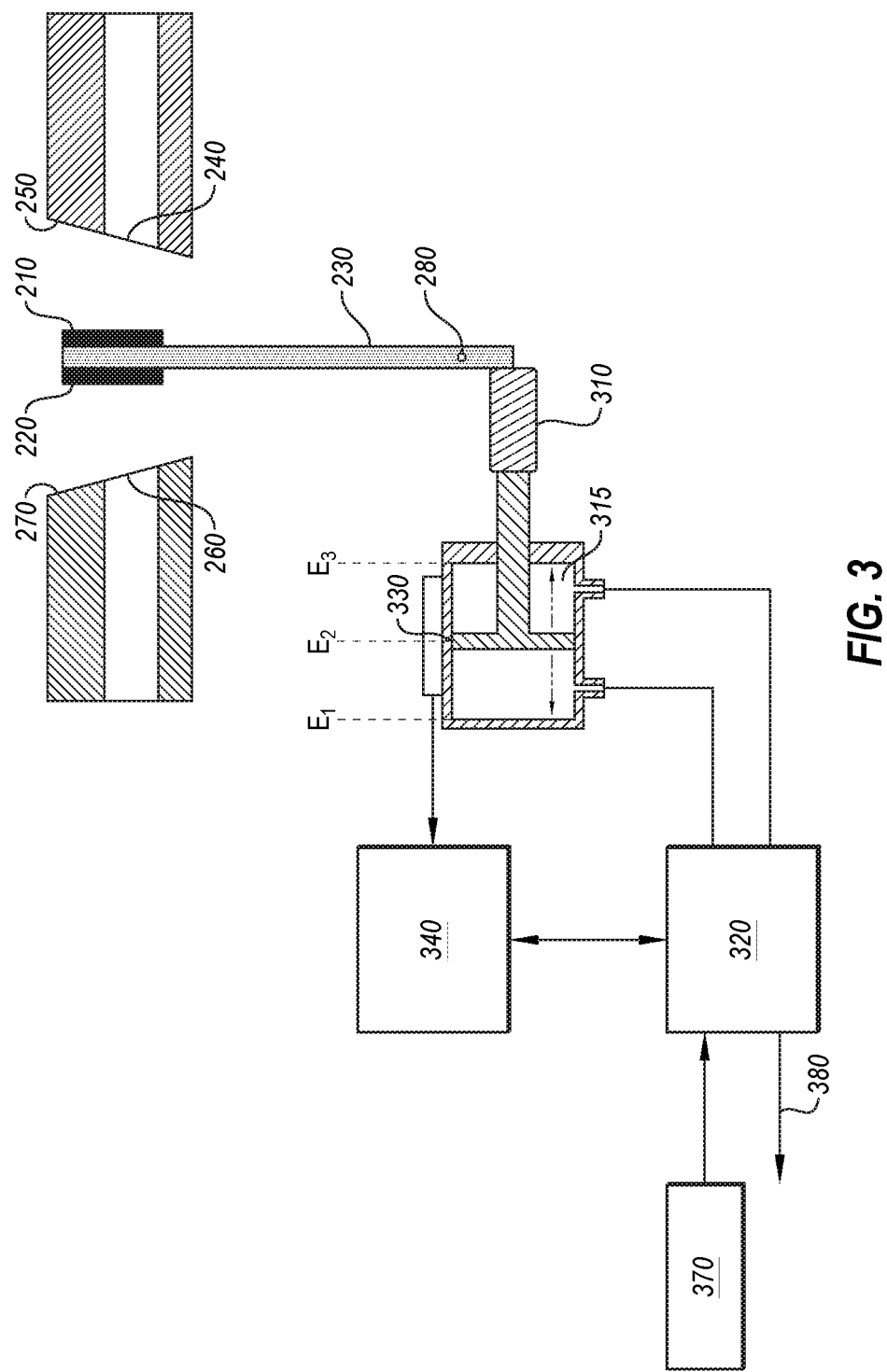
FIG. 3 illustrates simplified schematic of a pneumatic tilting mechanism in accordance with an embodiment.

FIG. 3 depict an exemplary tilting mechanism that includes at least one pneumatic actuator according to certain embodiments. The pneumatic actuator 315 includes at least one moving member 310 coupled to the shaft 230, at least one proportional pneumatic valve 320, a continuous position sensor 330, and a controller 340. The proportional pneumatic valve 320 is configured to control fluid pressure and/or fluid flow between a pressurized fluid supply 370 or a vent 380 and the at least one pneumatic actuator 315. Each proportional pneumatic valve 320 may include a plurality of controllers (not shown in FIG. 3) each configured to independently measure and/or control fluid pressure and/or fluid flow in respective supply lines to the at least one pneumatic actuator. The continuous position sensor 330 is configured to continuously determine a position of combined unit of the shaft 230, the first gate 210, and the second gate 220 (e.g., by continuously determining a linear position of the moving member 310). In embodiments, the pneumatic actuator is configured to perform horizontal actuation, which is translated into a radial or tilting motion by the pivot point 280. In embodiments, horizontal position of the actuator is translated into a radial position of the gates as described earlier herein.

The controller 340 (which may be the same as controller 665 or communicate with controller 665) is configured to maintain a closed loop that accounts for a pre-set commanded position trajectory/profile of the combined unit of the shaft 230, the first gate 210, and the second gate 220 (i.e., the commanded position profile), the position measurement of the combined unit (i.e., the real time/in-situ actual position/motion profile of the combined unit), and the error between the real time/in-situ actual position/motion profile of the combined unit and the position trajectory (or commanded position), and provides feedback to the pneumatic tilting mechanism to adjust various constituents of the pneumatic tilting mechanism (e.g., the proportional pneumatic valve 320) in order to adjust the operation of the combined unit so that it follows the commanded position trajectory more closely. Calculating the error between the pre-set commanded position trajectory and the actual real-time/in-situ position measurement and adjusting the actuation to correct for this error may be performed using a proportional-integral-derivative (PID) controller.

In certain embodiments, the controller 340 is configured to: receive a pre-set commanded position trajectory for the moving member 310 (or for the combined unit of the shaft 230, the first gate 210, and the second gate 220), receive the linear position measurement of the moving member 310 (or the position measurement of the combined unit) from the continuous position sensor 330 (also may be referred to as an actual real-time/in-situ position measurement), and receive fluid pressure and/or fluid flow measurement in the respective supply lines to the at least one pneumatic actuator 315 from the plurality of fluid pressure and/or fluid flow controllers in the proportional pneumatic valve 320. A "fluid pressure and/or fluid flow measurement" refers to the actual real-time/in-situ fluid pressure and/or fluid flow in the respective supply lines.

In certain embodiments, the controller 340 is further configured to generate a control signal based on the pre-set commanded position trajectory, the real-time/in-situ position measurement, and the fluid pressure and/or fluid flow measurement. The continuous position sensor 320 generates the position measurement that provides knowledge as to the whereabouts of the combined unit (i.e., the shaft 230, the first gate 210, and the second gate 220) throughout its full stroke (i.e., its full movement between the open intermediate position (as shown in FIG. 2A) and the closed position (as shown in FIG. 2B or 2C)). In certain embodiments, the continuous position sensor 320 is configured to generate a continuous analog output or a continuous digital output indicative of the linear position in real time/in-situ of the moving member 310 throughout its motion from one end position to another end position. This output may be transformed to provide a position measurement of the combined unit (e.g., angular position or an angular motion of the combined unit). Non-limiting examples of suitable continuous position sensors include at least one of a varistor, an inductive sensor, an encoder, a light based system, or a capacitive based system.

Exemplary end positions are marked in FIG. 3 as E1, E2, E3. For instance, in the embodiment illustrated in FIG. 3, when moving member 310 is in end position E1, the combined unit of the shaft 230, the first gate 210, and the second gate 220 may be tilted in a default position (e.g., towards a first sealed gate position as shown in FIG. 2B). In the embodiment illustrated in FIG. 3, when moving member 310 is in end position E2, the combined unit of the shaft 230, the first gate 210, and the second gate 220 may be in a non-tilted position (e.g., in an intermediate open position shown in FIG. 2A). In the embodiment illustrated in FIG. 3, when moving member 310 is in end position E3, the combined unit of the shaft 230, the first gate 210, and the second gate 220 may be tilted towards a second sealed gate position as shown in FIG. 2C.

The controller 340 may calculate the error between the combined unit's (or moving member's) pre-set commanded position trajectory and actual real-time/in-situ position measurement (obtained from the continuous position sensor 330). The controller 340 could account for the calculated error and the measured fluid pressure and/or fluid flow in the plurality of supply lines, and generate a control signal to adjust the fluid pressure and/or fluid flow in the respective supply lines so as to actuate/operate the combined unit closer to the pre-set commanded position trajectory.

In certain embodiments, the controller 340 is further configured to transmit the control signal to the at least one proportional pneumatic valve 320. Transmitting the control signal to the at least one proportional pneumatic valve 320 assists in controlling the fluid pressure and/or fluid flow between a pressurized fluid supply 370 or a vent 380 and the at least one pneumatic actuator 315. Transmitting the control signal to the at least one proportional pneumatic valve 320 also assists in controlling the fluid pressure and/or fluid flow in the respective supply lines to the at least one pneumatic actuator 315. The fluid pressure and/or fluid flow between the pressurized fluid supply line 370 or vent 380 and the at least one pneumatic actuator 315 together with the fluid pressure and/or fluid flow in the respective supply lines in the at least one proportional pneumatic valve 320 to the at least one pneumatic actuator 315 control at least one of the velocity or the force of the moving member 310 and correspondingly of the combined unit (i.e., the shaft 230, the first gate 210, and the second gate 220).

In certain embodiments, the proportional pneumatic valve includes an analog control configured to vary fluid flow between full flow and no flow. A variety of proportional pneumatic valves may be suitably utilized in the slit valve apparatuses described herein. For instance, in certain embodiments, the proportional pneumatic valve is a poppet valve or a proportional spool valve.

Figure 4:
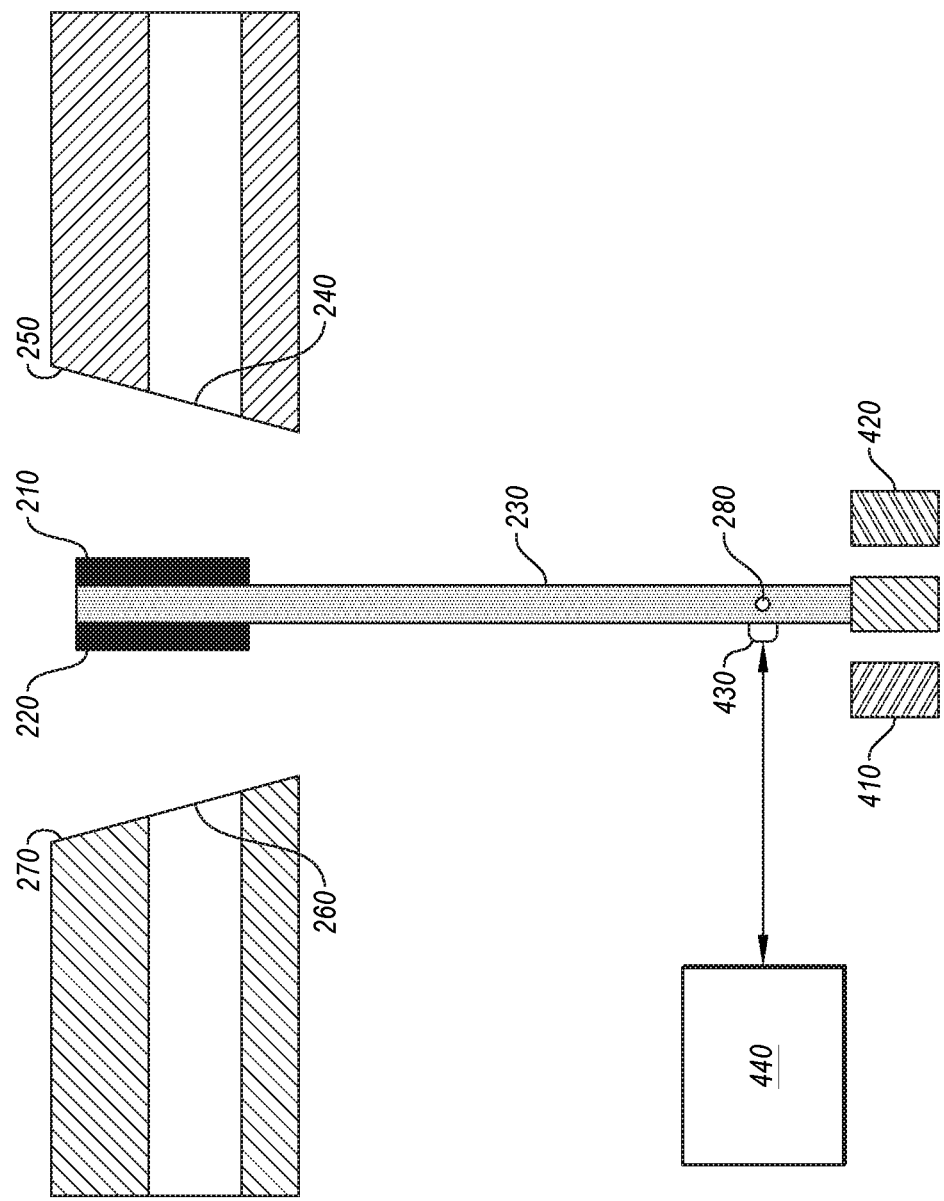
FIG. 4 illustrates simplified schematic of an electro-magnetic tilting mechanism in accordance with an embodiment of the present disclosure.

FIG. 4 depicts an exemplary tilting mechanism the includes an electro-magnetic mechanism according to certain embodiments. The electro-magnetic mechanism includes one or more electro-magnets 410, 420, an encoder 430, and a controller 440. The one or more electro-magnets 410, 420 are configured to tilt the combined unit of the shaft 230, the first gate 210, and the second gate 220 together in a first direction to the first sealed gate position (as shown in FIG. 2B) and in a second direction to the second sealed gate position (as shown in FIG. 2C). The encoder 430 may be coupled to the pivot point 280 and may be configured to determine at least one of an angular position or an angular motion of the shaft 230. Alternately, a linear encoder may be used. In embodiments, the pneumatic actuator is configured to perform horizontal actuation, which is translated into a radial or tilting motion by the pivot point 280. In embodiments, in which a linear encoder is used to detect horizontal position of the actuator, the horizontal position is translated into a radial position of the gates as described earlier herein. The controller 440 (which may be the same as controller 665 or communicate with controller 665) is configured to control at least one of the velocity or the force of the combined unit of the shaft 230, the first gate 210, and the second gate 220, based on measurements from the encoder 430 and control the one or more electro-magnets 410, 420 in view of these measurements.

Encoder 430 may be one example of a continuous position sensor. However, as indicated above with respect to FIG. 3, other continuous position sensors may also be suitably utilized in the electro-magnetic mechanism. Non-limiting examples of suitable continuous position sensors include at least one of a varistor, an inductive sensor, an encoder, a light based system, or a capacitive based system.

In certain embodiments, the tilting mechanism (e.g., the electro-magnetic mechanism) further includes a first permanent magnet (not shown) configured to tilt the combined unit of the shaft 230, the first gate 210, and the second gate 220 in a first direction to bias the dual gate system in the first sealed gate position (shown in FIG. 2B). In this embodiment, the one or more electro-magnets (e.g., 420) may be configured to overcome a force of the first permanent magnet to tilt the combined unit of the shaft 230, the first gate 210, and the second gate 220 in a second direction. Alternatively, a spring may be used to bias the dual gate system in the first sealed gate position.

The description that the first permanent magnet is configured to tilt the combined unit of the shaft 230, the first gate 210, and the second gate 220 in a first direction to bias the dual gate system in the first sealed gate position should not be construed as limiting. In certain embodiments, the electro-magnetic mechanism may include a first permanent magnet (not shown) to tilt the combined unit of the shaft 230, the first gate 210, and the second gate 220 in a second direction to bias the dual gate system in the second sealed gate position (shown in FIG. 2C). In this embodiment, the one or more electro-magnets (e.g., 410) are configured to overcome a force of the first permanent magnet to tilt the combined unit of the shaft 230, the first gate 210, and the second gate 220 in a first direction.

In embodiments, the first permanent magnet (or spring) is configured to bias the dual gate system in one direction so that if, for instance, there is a sudden loss of power to the system, the dual gate system remains in a default closed position (e.g., in a first sealed gate position or in a second sealed gate position), and the dual gate system does not suddenly stop isolating the adjacent stations by opening the interface between two adjacent stations, since that could be unsafe. Instead, the force of the first permanent magnet (or spring) can be overcome via a controller 440 that controls operation of the one or more electro-magnets 410, 420.

In certain embodiments, the tilting mechanism (e.g., electro-magnetic mechanism) further includes a spring (not shown) configured to tilt the combined unit of the shaft 230, the first gate 210, and the second gate 220 in a first direction to bias the dual gate system in the first sealed gate position (shown in FIG. 2B). In this embodiment, the one or more electro-magnets (e.g., 420) are configured to overcome a force of the spring to tilt the combined unit of the shaft 230, the first gate 210, and the second gate 220 in a second direction.

The description that the spring is configured to tilt the combined unit of the shaft 230, the first gate 210, and the second gate 220 in a first direction to bias the dual gate system in the first sealed gate position should not be construed as limiting. In certain embodiments, the electro-magnetic mechanism may include a spring (not shown) to tilt the combined unit of the shaft 230, the first gate 210, and the second gate 220 in a second direction to bias the dual gate system in the second sealed gate position (shown in FIG. 2C). In this embodiment, the one or more electro-magnets (e.g., 410) are configured to overcome a force of the spring to tilt the combined unit of the shaft 230, the first gate 210, and the second gate 220 in a first direction.

The spring, like the permanent magnet described above, is an alternative option configured to bias the dual gate system in one direction so that if, for instance, there is a sudden loss of power to the system, the dual gate system remains in a default closed position (e.g., in a first sealed gate position or in a second sealed gate position), and the dual gate system does not suddenly stop isolating the adjacent stations by opening the interface between two adjacent stations, since that could be unsafe. Instead, the force of the spring (which may be designed to be biased in either direction) can be overcome via a controller 440 that controls operation of the one or more electro-magnets 410, 420.

Similarly to controller 340 described with respect to FIG. 3, controller 440 is configured to maintain a closed loop that accounts for a pre-set commanded position trajectory/profile of the combined unit of the shaft 230, the first gate 210, and the second gate 220 (i.e., the commanded position profile), the position measurement of the combined unit (i.e., the real time/in-situ actual position/motion profile of the combined unit), and the error between the real time/in-situ actual position/motion profile of the combined unit and the position trajectory (or commanded position), and provide feedback to the electro-magnetic tilting mechanism to adjust various constituents of the electro-magnetic tilting mechanism (e.g., the one or more electro-magnets 410, 420) in order to adjust the operation of the combined unit so that it follows the commanded position trajectory more closely. Calculating the error between the pre-set commanded position trajectory and the actual real-time/in-situ position measurement and adjusting the actuation to correct for this error may be performed using a proportional-integral-derivative (PID) controller.

In certain embodiments, the controller 440 is configured to: receive a pre-set commanded position trajectory for the combined unit of the shaft 230, the first gate 210, and the second gate 220; receive the actual real-time/in-situ position measurement of the combined unit from the encoder 430 (or other continuous position sensor), and receive the electro-magnetic force measurement exerted by the electro-magnetic mechanism on the combined unit. A "electro-magnetic force measurement" refers to the actual real-time/in-situ electro-magnetic force exerted by the various constituents of the electro-magnetic tilting mechanism on the combined unit of the shaft 230, the first gate 210, and the second gate 220.

In certain embodiments, the controller 440 is further configured to generate a control signal based on the pre-set commanded position trajectory, the real-time/in-situ position measurement, and the electro-magnetic force measurement. The encoder 430 (or other continuous position sensor) generates the position measurement that provides knowledge as to the whereabouts of the combined unit (i.e., the shaft 230, the first gate 210, and the second gate 220) throughout its full movement between the open intermediate position (shown in FIG. 2A) and the closed position (shown in FIGS. 2B or 2C). As described with respect to FIG. 3, in this embodiment, encoder 430 (or other continuous position sensor) may also be configured to generate a continuous analog output or a continuous digital output indicative of the position in real time/in-situ of the combined unit (i.e., the shaft 230, the first gate 210, and the second gate 220) throughout its motion from one end position to another end position. The various end positions that can be reached with the electro-magnetic tilting mechanisms are those depicted with respect to FIGS. 2A, 2B, and 2C.

The controller 440 may calculate the error between the combined unit's (i.e., the shaft 230, the first gate 210, and the second gate 220) pre-set commanded position trajectory and actual real-time/in-situ position measurement (obtained from encoder 430 or other continuous position sensor). The controller 440 could account for the calculated error and the measured electro-magnetic force exerted on the combined unit, and generate a control signal to adjust the electro-magnetic force in the one or more electro-magnets 410, 420 so as to operate the combined unit closer to the pre-set commanded position trajectory.

In certain embodiments, the controller 440 is further configured to transmit the control signal to the one or more electro-magnets 410, 420. Transmitting the control signal to the one or more electro-magnets 410, 420 assists in controlling the force exerted by the various constituents of the electro-magnetic tilting mechanism on the combined unit of the shaft 230, the first gate 210, and the second gate 220, and correspondingly in controlling at least one of the velocity or the force of the combined unit.

Figure 5:
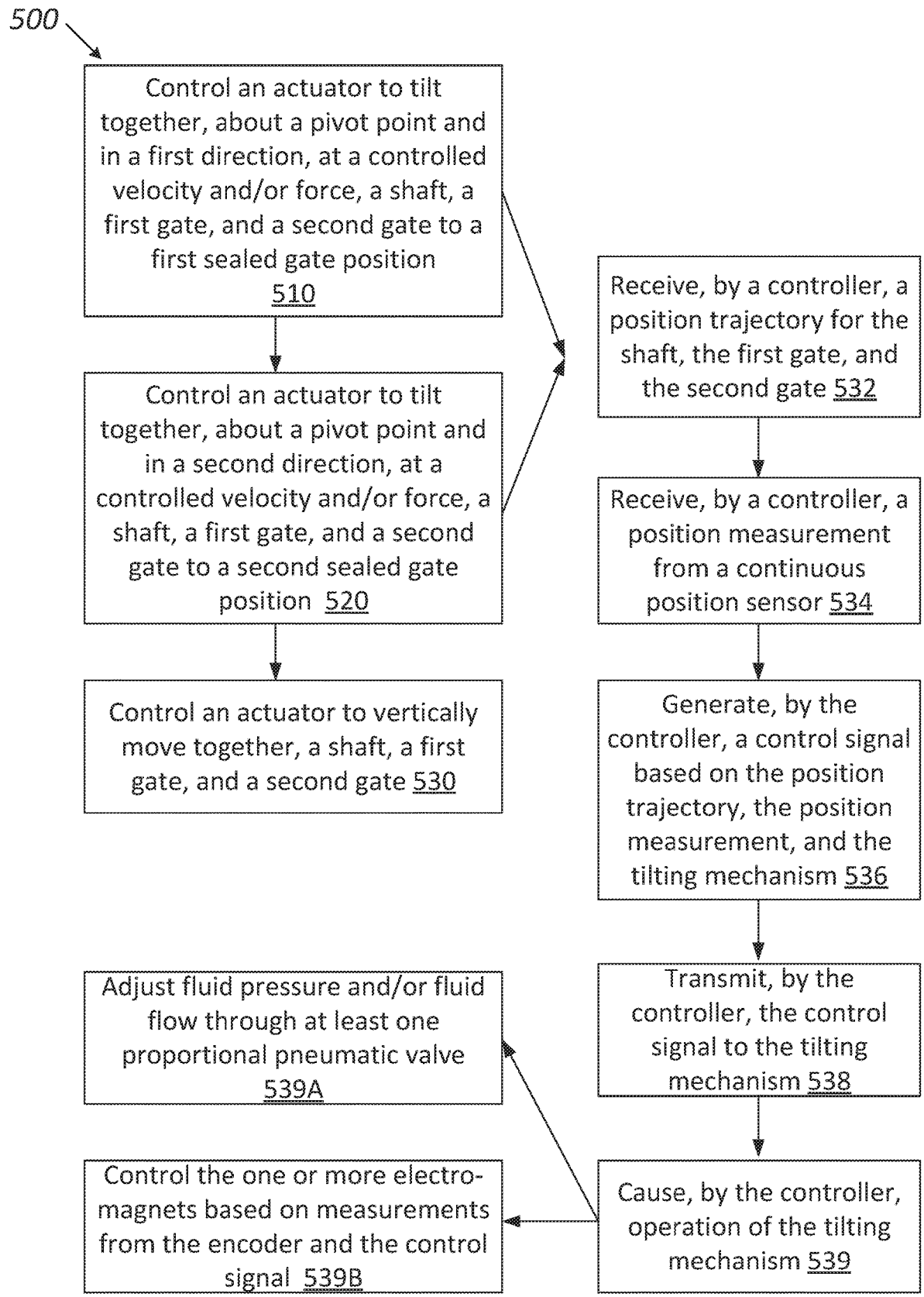
FIG. 5 is a flow chart of a method for operating a dual gate system in accordance with embodiments of the present disclosure (for example, with a pneumatic tilting mechanism of FIG. 3 or with an electro-magnetic tilting mechanism of FIG. 4).

FIG. 5 illustrates a simplified schematic of operational method 500 of a dual gate system in accordance with embodiments. In certain embodiments, method 500, according to block 510, includes controlling an actuator to tilt together, about a pivot point (e.g., 280) and in a first direction, at a controlled velocity and/or force, a combined unit of a shaft (e.g., 230), a first gate (e.g., 210) coupled to a first side of the shaft, and a second gate (e.g., 220) coupled to a second side of the shaft, to a first sealed gate position. FIG. 2B depicts an exemplary first sealed gate position which includes a first seal of the first gate 210 against a first slot 240 on a first side 250 of the dual gate system that couples to the first chamber of an electronics device processing system.

In certain embodiments, method 500, according to block 520, includes controlling an actuator to tilt together, about a pivot point (e.g., 280) and in a second direction, at a controlled velocity and/or force, a combined unit of a shaft (e.g., 230), a first gate (e.g., 210) coupled to a first side of the shaft, and a second gate (e.g., 220) coupled to a second side of the shaft, to a second sealed gate position. FIG. 2C depicts an exemplary second sealed gate position which includes a second seal of the second gate 220 against a second slot 260 on a second side 270 of the dual gate system that couples to the second chamber of an electronics device processing system.

In certain embodiments, method 500, according to block 530, includes vertically moving together (upwards or downwards) the shaft (e.g., 230), the first gate (e.g., 210), and the second gate (e.g., 220) via a vertical motion actuation mechanism (e.g., 290).

In certain embodiments, the velocity and/or force are controlled in method 500 (i.e., in blocks 510 and 520) via interaction of a controller (e.g., 340, 440) with various constituents of any of the tilting mechanisms described herein (e.g., constituents of a pneumatic tilting mechanism, such as those described with respect to FIG. 3 or of an electro-magnetic tilting mechanism such as those described with respect to FIG. 4).

In certain embodiments, the velocity and/or force (in blocks 510 and/or 520) are controlled in accordance with blocks 532, 534, 536, 538, and 539, listed in FIG. 5, which may be performed in the order presented herein or in any other suitable order. Block 532 includes receiving, by a controller (e.g., 340, 440), a pre-set commanded position and/or trajectory for the combined unit of the shaft (e.g., 230), the first gate (e.g., 210), and the second gate (e.g., 220). Block 534 includes receiving, by the controller (e.g., 340, 440), a position measurement from a continuous position sensor (e.g., 330, 430) that continuously determines the real time/in-situ position of the combined unit of the shaft (e.g., 230), the first gate (e.g., 210), and the second gate (e.g., 220). Block 536 includes generating, by the controller (e.g., 340, 440), a control signal based on the pre-set commanded position and/or trajectory (e.g., from block 532), the position measurement (e.g., from block 534), and the tilting mechanism (e.g., 242) coupled to the shaft (e.g., 230). In one embodiment, the controller compute a velocity and/or acceleration of the gates based on position measurements taken over time. In one embodiment, positions of a horizontal actuator over time are determined, and each such position is translated into a position of one or more of the gates. The translated positions may be used to compute an angular velocity and/or angular acceleration of the gates based on horizontal position measurements of the actuator. Alternatively, if a radial encoder is used at the pivot point to measure position, then readings from the radial encoder may be translated into position measurements of the gates and used to compute velocity and/or acceleration of the gates.

Block 538 includes transmitting, by the controller (e.g., 340, 440), the control signal to the tilting mechanism (e.g., 242). Block 539 includes causing, by the controller (e.g., 340, 440), operation of the tilting mechanism (e.g., 242).

In one embodiment, the tilting mechanism is pneumatic and includes a pneumatic actuator (e.g., 315) that includes at least one moving member (e.g., 310) coupled to the shaft (e.g., 230) and at least one proportional pneumatic valve (e.g., 320). In such embodiments, causing, by the controller, operation of the tilting mechanism (per block 539 in FIG. 5), includes controlling at least one of the velocity or the force of the combined unit of the shaft (e.g., 230), the first gate (e.g., 210), and the second gate (e.g., 220) by adjusting, based on the control signal (generated in block 536 in FIG. 5 and transmitted in block 538 in FIG. 5), fluid pressure and/or fluid flow through the at least one proportional pneumatic valve (e.g., 320), in accordance with block 539A.

In another embodiment, the tilting mechanism is an electro-magnetic mechanism that includes one or more electro-magnets (e.g., 410, 420) that tilt the combined unit of the shaft (e.g., 230), the first gate (e.g., 210), and the second gate (e.g., 220) in a first direction to a first sealed gate position (as shown in FIG. 2B) or to a second direction to a second sealed gate position (as shown in FIG. 2C). The tilting mechanism may also include an encoder (e.g., 430) or any other continuous position sensor that determines at least one of an angular position or an angular motion of the shaft (e.g., 230). In such embodiments, causing, by the controller, operation of the tilting mechanism (per block 539 in FIG. 5), includes controlling at least one of the velocity or the force of the combined unit of the shaft (e.g., 230), the first gate (e.g., 210), and the second gate (e.g., 220) by controlling, based on measurements from the encoder and the control signal (generated in block 536 in FIG. 5 and transmitted in block 538 in FIG. 5), the one or more electro-magnets (e.g., 410, 420), in accordance with block 539B.

In certain embodiments, an electro-magnetic mechanism may further include a first permanent magnet or a spring that tilt the combined unit of the shaft (e.g., 230), the first gate (e.g., 210), and the second gate (e.g., 220) in the first direction (or in the second direction) to bias the dual gate system in the first sealed gate position (or in the second sealed gate position), as described hereinbefore with respect to FIG. 4. In such embodiments, causing, by the controller, operation of the tilting mechanism (per block 539 in FIG. 5), includes controlling at least one of the velocity or the force of the combined unit of the shaft (e.g., 230), the first gate (e.g., 210), and the second gate (e.g., 220) by controlling, based on measurements from the encoder and the control signal (generated in block 536 in FIG. 5 and transmitted in block 538 in FIG. 5), the one or more electro-magnets (e.g., 410, 420) to overcome a force of the first permanent magnet or of the spring to tilt the combined unit of the shaft (e.g., 230), the first gate (e.g., 210), and the second gate (e.g., 220) in the opposite direction from where it is biased.

In operation of any of the tilting mechanisms described herein, to reach a first sealed gate position (as shown in FIG. 2B) or a second sealed gate position (as shown in FIG. 2C) from an open gate position (as shown in FIG. 2D), the combined unit of the shaft (e.g., 230), the first gate (e.g., 210), and the second gate (e.g., 220) are moved vertically upwards together, via a vertical motion actuation mechanism (e.g., 290), to an intermediate open gate position (as shown in FIG. 2A). The intermediate open gate position may also be referred to herein as "a non-tilted position." Thereafter, the combined unit of the shaft (e.g., 230), the first gate (e.g., 210), and the second gate (e.g., 220) are tilted together, about a pivot point (e.g., 280), towards a first direction to a first sealed gate position (as shown in FIG. 2B) or towards a second direction to a second sealed gate position (as shown in FIG. 2C).

In operation of any of the tilting mechanisms described herein, to reach a first sealed gate position (as shown in FIG. 2B) from a second sealed gate position (as shown in FIG. 2C) or vice versa, the combined unit of the shaft (e.g., 230), the first gate (e.g., 210), and the second gate (e.g., 220) are tilted together, about a pivot point (e.g., 280), towards a direction that is opposite the direction that the combined unit is already tilted against. For example, in the second sealed gate position (shown in FIG. 2C), the combined unit is already tilted against the second direction. Thus, to reach a first sealed gate position (as shown in FIG. 2B) from a second sealed gate position (as shown in FIG. 2C), the combined unit is tilted, about the pivot point, in a first direction. In a different example, the combined unit is in the first sealed gate position (shown in FIG. 2B) and the combined unit is already tilted against the first direction. Thus, to reach a second sealed gate position (as shown in FIG. 2C) from a first sealed gate position (as shown in FIG. 2B), the combined unit is tilted, about the pivot point, in a second direction.

In operation, to reach an open gate position (as shown in FIG. 2D), from either a first sealed gate position (shown in FIG. 2B) or a second sealed gate position (shown in FIG. 2C), the combined unit of the shaft (e.g., 230), the first gate (e.g., 210), and the second gate (e.g., 220) are tilted together, about a pivot point (e.g., 280), towards a direction that is opposite the direction that the combined unit is already tilted against, to reach an intermediate open gate position (as shown in FIG. 2A). The intermediate open gate position may also be referred to herein as "a non-tilted position." Thereafter, the combined unit of the shaft (e.g., 230), the first gate (e.g., 210), and the second gate (e.g., 220) are moved vertically downwards together, via a vertical motion actuation mechanism (e.g., 290), from the intermediate open gate position (as shown in FIG. 2A) to the open gate position (shown in FIG. 2D).

In certain embodiments, the instant disclosure moves the combined unit of the shaft (e.g., 230), the first gate (e.g., 210), and the second gate (e.g., 220) to a first sealed gate position or to a second sealed gate position using a cam follower mechanism, as shown and described in further detail with respect to FIGS. 6A-6C. This embodiment uses a combination of a vertical actuator motion and a passive cam follower track motion to raise or lower the combined unit of the shaft, the first gate, and the second gate out of the wafer transfer path and to selectively close the first slot or the second slot. The cam follower track switches from a first cam follower track to a second cam follower track, using a cam follower track switch, to selectively close the first slot or the second slot. Each cam follower track is shaped and/or configured to transfer load from a vertical cam follower track portion to the first gate or to the second gate to seal. Furthermore, each cam follower track is shaped and/or configured to produce perpendicular motion between the sealing gate and the corresponding side that is being sealed.

The dual gate system depicted in FIGS. 6A-6C is similar to the dual gate system depicted in FIGS. 2A-2C in including a first gate 610 (similar to 210), a second gate 620 (similar to 220), a shaft 630 (similar to 230). Instead of referring to a tilting mechanism, the cam follower mechanism depicted in FIGS. 6A-6C will be referred to as a sealing mechanism 642. The shaft 630 is coupled to the first gate 610, to the second gate 620, and to the sealing mechanism

642. As shown in FIGS. 6A-6C, the first gate 610 is coupled to a first side of the shaft 630 and the second gate 620 is coupled to a second side of the shaft 630. The first side of the shaft 630 may be opposite the second side of the shaft 630 such that the first gate 610 and the second gate 620 are coupled to opposite sides of the shaft 630.

The first gate 610 is configured to form a first seal against a first slot 640 (similar to 240) on a first side 650 (similar to 250) of the dual gate system that couples to a first chamber (or a first station) of an electronics device processing system (or wafer processing system). The second gate 620 is configured to form a second seal against a second slot 660 (similar to 260) on a second side 670 (similar to 270) of the dual gate system that couples to a second chamber (or a second station) of an electronics device processing system (or wafer processing system). In certain embodiments, the second side 670 is opposite the first side 650 and the second slot 660 is opposite the first slot 640.

In certain embodiments, as described with respect to previous figures, at least one of the first gate 610 and the second gate 620 is removable from the shaft 630. In one embodiment, the first gate 610 and the second gate 620 are both removable from the shaft 630. The dimensions of the combined unit of the shaft 630, the first gate 610, and the second gate 620 may be compact in dimensions while still providing sufficient room for an operator and/or a robot to readily access the port 675 and remove at least one of the first gate 610 or the second gate 620 (or to place at least one of the first gate 610 or the second gate 620 after it has been replaced and/or cleaned and/or serviced).

Each of the first gate 610 and the second gate 620 may be coupled to the shaft in a manner such that the contact of each of the gates with its corresponding side (i.e., the first gate 610 with the first side 650 or the second gate 620 with the second side 670) is orthogonal. Orthogonal contact between the gate and its corresponding side upon their contacting reduces friction, wear of the sealing interface on the gate and its corresponding contact side, and the number of particles generated from such wear.

In certain embodiments, at least a portion of the first side 650 to which the first gate 610 makes contact is at a first angle $\alpha_1$ to vertical (the vertical being designated by Z) such that the first gate 610 orthogonally contacts the portion of the first side 650 upon tilting to the first sealed gate position to seal the first slot 640 (as shown in FIG. 6B and similar to FIG. 2B). In certain embodiments, the first angle $\alpha_1$ is about 1° to about 20°, about 3° to about 18°, about 5° to about 15°, about 8° to about 12°, or any sub-range therein, with all angles being measured to vertical in the first direction.

In certain embodiments, at least a portion of the second side 670 to which the second gate 620 makes contact is at a second angle $\alpha_2$ to vertical (the vertical being designated by Z) such that the second gate 620 orthogonally contacts the portion of the second side 670 upon tilting to the second sealed gate position to seal the second slot 660 (as shown in FIG. 6C and similar to FIG. 2C). In certain embodiments, the second angle is about 1° to about 20°, about 3° to about 18°, about 5° to about 15°, about 8° to about 12°, or any sub-range therein, with all angles being measured to vertical in the second direction.

In certain embodiments, the sealing mechanism includes a first cam follower track 680, a second cam follower track 690, a cam follower track switch 685, and a controller 695 (similar to controllers 340 and 440).

First cam follower track 680 is configured to seal the first gate 610 to the first slot 640 by moving the combined unit of the shaft 630, the first gate 610, and the second gate 620 along the first cam follower track 680 to a first sealed gate position. The first sealed gate position is shown in FIG. 6B and may be similar to the one shown and described with respect to FIG. 2B. In the first sealed gate position, the first gate 610 is compressed against the first side 650. In certain embodiments, there is at least one o-ring on the first gate 610 and/or on the first side 650. When the first gate 610 is compressed against the first side 650, the at least one o-ring on the first gate 610 and/or on the first side 650 is compressed between the first gate 610 and the first side 650.

Second cam follower track 690 is configured to seal the second gate 620 to the second slot 660 by moving the combined unit of the shaft 630, the first gate 610, and the second gate 620 along the second cam follower track 690 to a second sealed gate position. The second sealed gate position is shown in FIG. 6C and may be similar to the one shown and described with respect to FIG. 2C. In the second sealed gate position, the second gate 620 is compressed against the second side 670. In certain embodiments, there is at least one o-ring on the second gate 620 and/or on the second side 670. When the second gate 620 is compressed against the second side 670, the at least one o-ring on the second gate 620 and/or on the second side 670 is compressed between the second gate 620 and the second side 670.

Cam follower track switch 685 is configured to switch between the first cam follower track 680 and the second cam follower track 690. A variety of cam follower track switches may be suitably used. In certain embodiments, the cam follower track switch includes a pneumatic cylinder, an electro-magnetic solenoid, or a similar lateral actuator. The controller 695 is configured to control at least one of a velocity or force of the combined unit of the shaft 630, the first gate 610, and the second gate 620. Controller 695 may be similar to controllers 340 in FIGS. 3 and 440 in FIG. 4. These controllers may be designated to control one sealing or tilting mechanism or a plurality of sealing or tilting mechanisms. In certain embodiments, these controllers may interacts with the wafer processing system controller 665 (in FIG. 1). In certain embodiments, controllers 695, 340, or 440 are the same as wafer processing system controller 665.

In certain alternative embodiments, the cam follower mechanism may include more than one cam follower track, e.g., similar to first cam follower track 680 and second cam follower track 690, and the cams could switch from one cam follower track to another cam follower track and vice versa, without utilizing a cam follower track switch. For instance, the cam may engage a first cam follower track to move along said first cam follower track. Then to move along a second cam follower track, the cam may disengage from the first cam follower track, engage the second cam follower track, and move along the second cam follower track. Similarly, the cam may disengage from the second cam follower track and engage the first cam follower track in order to again move along the first cam follower track.

Figure 6:
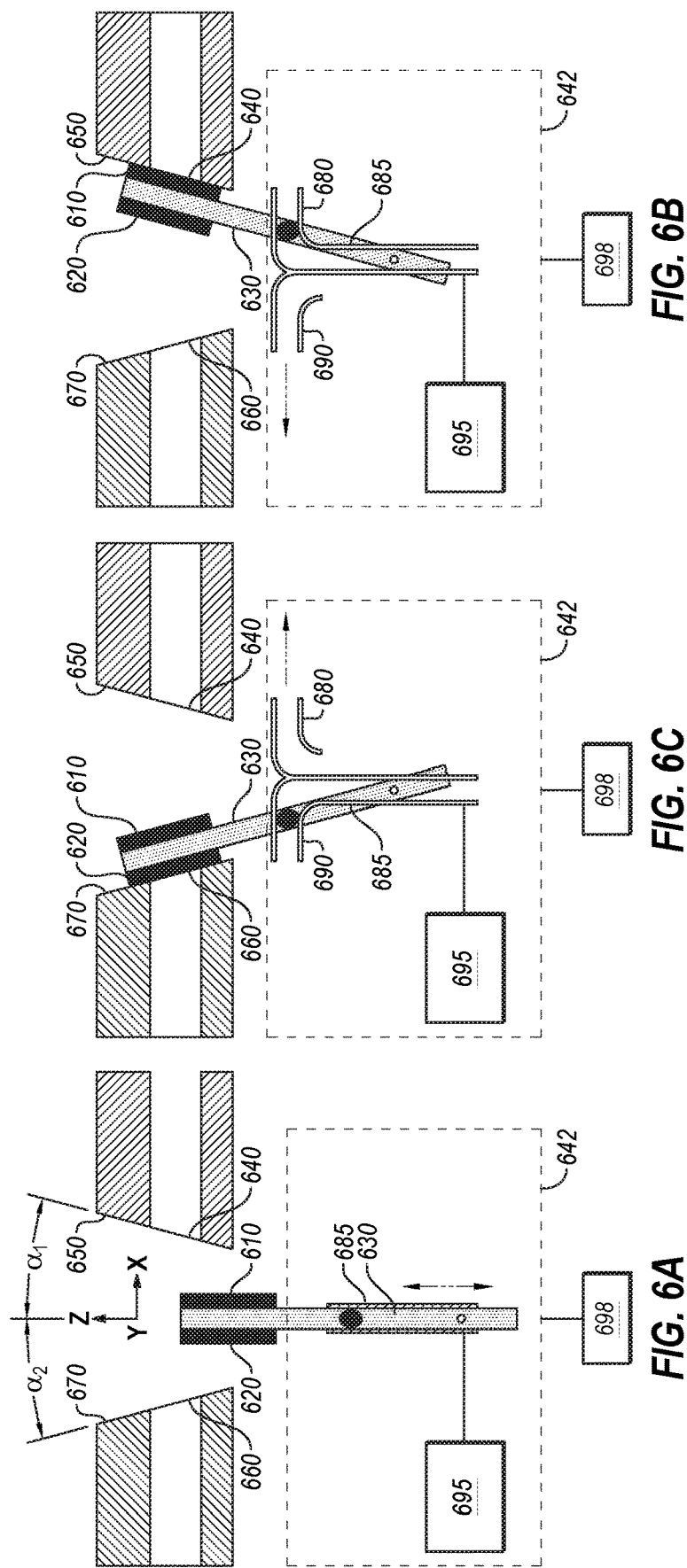
FIG. 6A illustrates a simplified schematic of a cam follower sealing mechanism in an intermediate open gate position in accordance with embodiments of the present disclosure.
FIG. 6B illustrates a simplified schematic of a cam follower sealing mechanism in a first sealed gate position in accordance with embodiments of the present disclosure.
FIG. 6C illustrates a simplified schematic of a cam follower sealing mechanism in a second sealed gate position in accordance with embodiments of the present disclosure.
Figure 7:
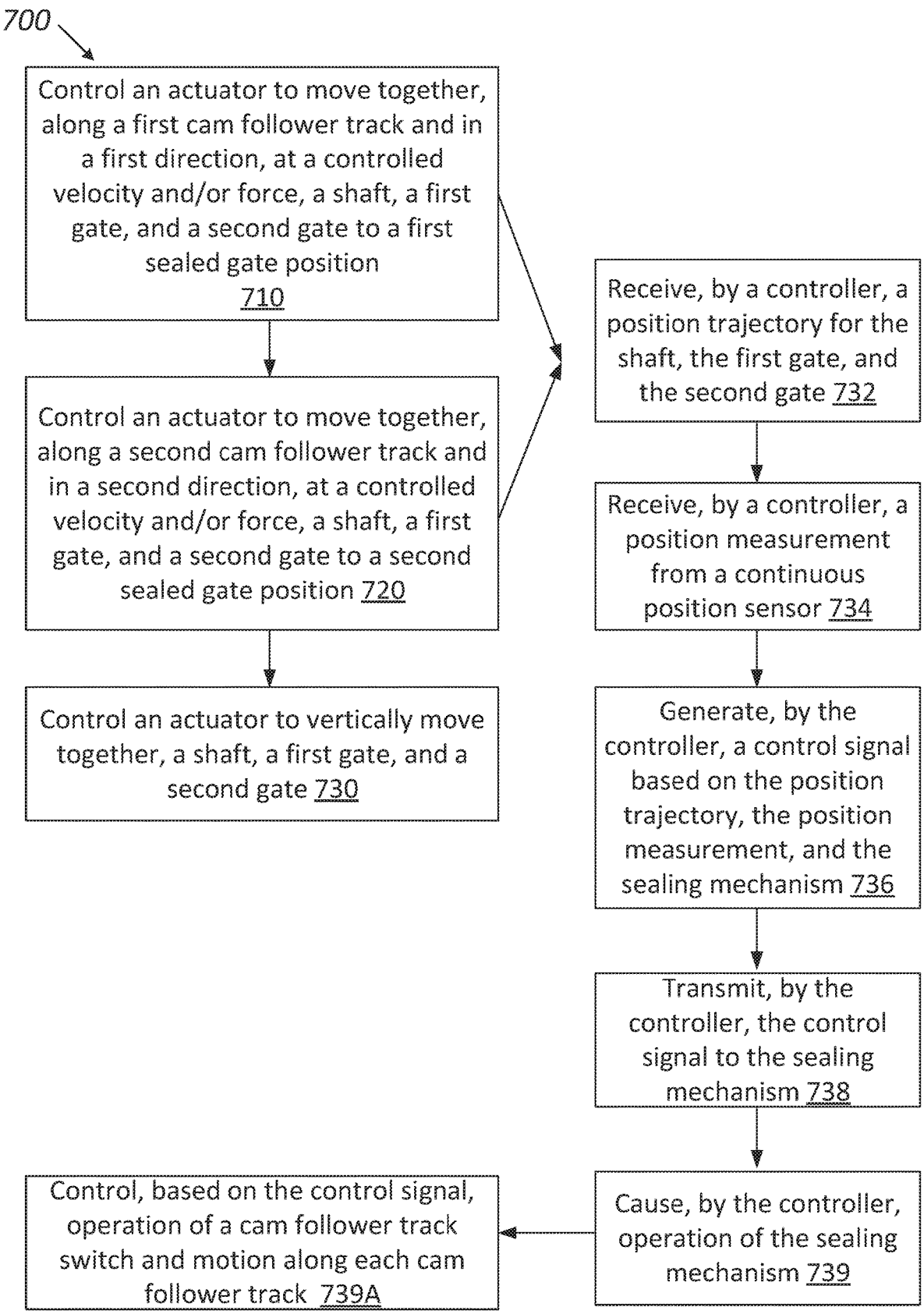
FIG. 7 is a flow chart of a method for operating a dual gate system including a cam follower sealing mechanism in accordance with embodiments of the present disclosure.

FIG. 7 illustrates operational method 700 of the dual gate system of FIGS. 6A-6C and is similar to operational method 500 described in FIG. 5. In certain embodiments, method 700, according to block 710, includes controlling an actuator to move together, along the first cam follower track (e.g., 680) and in a first direction, at a controlled velocity and/or force, a combined unit of a shaft (e.g., 630), a first gate (e.g., 610), and a second gate (e.g., 620), to a first sealed gate position (e.g., as depicted in FIG. 6B).

In certain embodiments, method 700, according to block 720, includes controlling an actuator to move together, along a second cam follower track (e.g., 690) and in a second direction, at a controlled velocity and/or force, a combined unit of a shaft (e.g., 630), a first gate (e.g., 610), and a second gate (e.g., 620), to a second sealed gate position (e.g., as depicted in FIG. 6C).

In certain embodiments, method 700, according to block 730, includes vertically moving together the shaft (e.g., 630), the first gate (e.g., 610), and the second gate (e.g., 620) via a vertical motion actuation mechanism (e.g., 698). The vertical motion actuation mechanism may be similar to the one described with respect to previous figures and may be decoupled from the cam follower sealing mechanism.

In certain embodiments, the velocity and/or force are controlled in method 700 (e.g., in blocks 710 and/or 720) via interaction of a controller (e.g., 695) with various constituents of any of the sealing mechanisms described herein. In certain embodiments, the velocity and/or force are controlled in accordance with blocks 732, 734, 736, 738, and 739, depicted in FIG. 7, which may be performed in the order presented herein or in any other suitable order. Block 732 includes receiving, by a controller (e.g., 695), a position and/or trajectory for the combined unit of the shaft (e.g., 630), the first gate (e.g., 610), and the second gate (e.g., 620). Block 734 includes receiving, by the controller (e.g., 695), a position measurement from a continuous position sensor that continuously determined the position of the combined unit of the shaft (e.g., 630), the first gate (e.g., 610), and the second gate (e.g., 620). Block 736 includes generating, by the controller (e.g., 695), a control signal based on the position and/or trajectory (e.g., from block 732), the position measurement (e.g., from block 734), and the sealing mechanism (e.g., 642) coupled to the shaft (e.g., 630). Block 738 includes transmitting, by the controller (e.g., 695), the control signal to the sealing mechanism (e.g., 642). Block 739 includes causing, by the controller (e.g., 695), operation of the sealing mechanism (e.g., 642).

In the embodiment where the sealing mechanism is a cam follower mechanism as depicted in FIG. 6, causing, by the controller, operation of the sealing mechanism (per block 739 in FIG. 7), includes controlling at least one of the velocity or the force of the combined unit of the shaft (e.g., 630), the first gate (e.g., 610), and the second gate (e.g., 620) by controlling, based on the control signal (generated in block 736 in FIG. 7 and transmitted in block 738 in FIG. 7), operation of the cam follower track switch 685 and motion along each cam follower track (e.g., 680 and 690), in accordance with block 739A.

In operation of the cam follower track mechanism, to reach a first sealed gate position (as shown in FIG. 6B) or a second sealed gate position (as shown in FIG. 6C) from an open gate position (not shown in FIGS. 6A-6C but would be similar to that shown in FIG. 2D), the combined unit of the shaft (e.g., 630), the first gate (e.g., 610), and the second gate (e.g., 620) are moved vertically upwards together, via a vertical motion actuation mechanism (e.g., 698), to an intermediate open gate position (as shown in FIG. 6A). The intermediate open gate position may also be referred to herein as "a non-tilted position." Thereafter, the combined unit of the shaft (e.g., 630), the first gate (e.g., 610), and the second gate (e.g., 620) are moved together, about a first cam follower track 680, towards a first direction to a first sealed gate position (as shown in FIG. 6B) or towards a second direction to a second sealed gate position (as shown in FIG. 6C).

In operation of the cam follower track mechanism, to reach an open gate position (not shown in FIGS. 6A-6C but would be similar to that shown in FIG. 2D) from a first sealed gate position (as shown in FIG. 6B) or from a second sealed gate position (as shown in FIG. 6C), the combined unit of the shaft (e.g., 630), the first gate (e.g., 610), and the second gate (e.g., 620) are moved together, along a first cam follower track 680 or along a second cam follower track 690, to an intermediate open gate position (as shown in FIG. 6A). Thereafter, the combined unit of the shaft (e.g., 630), the first gate (e.g., 610), and the second gate (e.g., 620) are moved vertically downwards together, via a vertical motion actuation mechanism (e.g., 698), from an intermediate open gate position (as shown in FIG. 6A) towards an open gate position (not shown in FIGS. 6A-6C but would be similar to that shown in FIG. 2D).

In operation of the cam follower track mechanism, to reach a first sealed gate position (as shown in FIG. 6B) from a second sealed gate position (as shown in FIG. 6C), the combined unit of the shaft (e.g., 630), the first gate (e.g., 610), and the second gate (e.g.,620) are moved together, along the second cam follower track 690, to an intermediate open gate position (as shown in FIG. 6A). Thereafter, the cam follower track switch 685 is operated so that the combined unit can move along the first cam follower track 680. Thereafter, the combined unit of the shaft (e.g., 630), the first gate (e.g., 610), and the second gate (e.g., 620) is moved together, along the first cam follower track 680, from the intermediate open gate position (as shown in FIG. 6A), to reach the first sealed gate position (as shown in FIG. 6B).

The reverse direction (from a first sealed gate position to a second sealed gate position) may also be reached by first moving the combined unit of the shaft (e.g., 630), the first gate (e.g., 610), and the second gate (e.g., 620) together, along the first cam follower track 680, to the intermediate open gate position (as shown in FIG. 6A). Thereafter, operating the cam follower track switch 685 so that the combined unit can move along the second cam follower track 690. Thereafter, moving, along the second cam follower track 690, the combined unit of the shaft (e.g., 630), the first gate (e.g., 610), and the second gate (e.g., 620) together, from the intermediate open gate position (as shown in FIG. 6A), to reach the second sealed gate position (as shown in FIG. 6C).

The wafer processing system and/or the actuation mechanisms described herein may be computer-controlled by a control unit (e.g., 665, 340, 440, 695). By executing programs (software) for processing wafer 101 based on predetermined recipes, various driving units of the substrate processing system operate and process wafer 101.

Further, it is to be understood that the methods disclosed herein may be attained by supplying to a computer (e.g., a control unit such as controllers 665, 340, 440, and/or 695) a storage medium in which a program code of software that realizes the functions of the aforementioned embodiments is stored, and then causing a processor (e.g., a central processing unit (CPU)) of the computer to read out and execute the program code stored in the storage medium. Alternatively another type of processing device such as a programmable logic controller (PLC), a system on a chip (SoC), etc. may execute the program code. The processor or processing device executing the program code may cause ionizers to activate, slit valves to open and/or close, inert gas to flow or stop flowing at set flow rates, wafers to be moved between locations by robots, and so on.

In this case, the program code itself read out from the storage medium realizes the functions of the aforementioned embodiments and, hence, the program code and the storage medium in which the program code is stored are also part of the disclosure.

Moreover, the storage medium for Supplying the program code may be, e.g., an RAM, an NV-RAM, a floppy (registered trademark) disk, a hard disk, a magnetic-optical disk, an optical disk such as a CD-ROM, a CD-R, a CD-RW, a DVD (a DVD-ROM, a DVD-RAM, a DVD-RW, a DVD+RW) or the like, a magnetic tape, a non-volatile memory card, another ROM or the like. Alternatively, the program code may be supplied to the computer by downloading from another computer (not shown), a database (not shown) or the like connected to the Internet, a commercial network, an LAN (local area network) or the like.

Besides, it is to be understood that the functions of the aforementioned embodiments may be accomplished not only by executing the program code read out by the computer, but also by causing an OS (operating system) or the like that operates on the processing device to perform a part or all of the actual operations based on instructions of the program code.

The program codes may take the form of an object code, a program code executed by an interpreter, script data supplied to an OS, or the like.

In the foregoing description, numerous specific details are set forth, such as specific materials, dimensions, processes parameters, etc., to provide a thorough understanding of the present disclosure. The particular features, structures, materials, or characteristics may be combined in any suitable manner in one or more embodiments. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is simply intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. Reference throughout this specification to "an embodiment", "certain embodiments", or "one embodiment" means that a particular feature, structure, or characteristic described in connection with the embodiment is included in at least one embodiment. Thus, the appearances of the phrase "an embodiment", "certain embodiments", or "one embodiment" in various places throughout this specification are not necessarily all referring to the same embodiment.

Embodiments of the present disclosure have been described with reference to specific exemplary embodiments thereof. The specification and drawings are, accordingly, to be regarded in an illustrative rather than a restrictive sense. Various modifications of the disclosure in addition to those shown and described herein will become apparent to those skilled in the art and are intended to fall within the scope of the appended claims.

We claim:

1. A method for operating a dual gate system, comprising:
controlling an actuator to move together, along a first cam follower track, a shaft, a first gate coupled to a first side of the shaft, and a second gate coupled to a second side of the shaft, wherein the first cam follower track is configured to tilt together, about a pivot point and in a first direction, at a controlled velocity and/or force, the shaft, the first gate, and the second gate to a first sealed gate position, wherein the first sealed gate position comprise a first seal of the first gate against a first slot on a first side of the dual gate system that couples to a first chamber of an electronics device processing system; and
controlling the actuator to move together, along a second cam follower track, the shaft, the first gate, and the second gate, to a second sealed gate position, wherein the second cam follower track is configured to tilt together, about the pivot point and in a second direction, at the controlled velocity and/or force, the shaft, the first gate, and the second gate, wherein the second sealed gate position comprises a second seal of the second gate against a second slot on a second side of the dual gate system that couples to a second chamber of the electronics device processing system;
wherein the velocity and/or the force are controlled via the actuator configured to control motion of the shaft along the first cam follower track or the second cam follower track, and wherein the motion of the shaft is laterally switchable between the first cam follower track or the second cam follower track via a cam follower track switch comprising a laterally moveable guide.

2. The method of claim 1, wherein at least a portion of the first side to which the first gate makes contact is at a first angle to vertical such that the first gate orthogonally contacts the portion of the first side upon tilting to the first sealed gate position to seal the first slot; and
wherein at least a portion of the second side to which the second gate makes contact is at a second angle to vertical such that the second gate orthogonally contacts the portion of the second side upon tilting to the second sealed gate position to seal the second slot.

3. The method of claim 1, further comprising vertically moving together the shaft, the first gate, and the second gate via a vertical actuator,
wherein to open a sealed first gate or a sealed second gate, the method comprises:
moving together the shaft, the first gate, and the second gate to an initial non-tilted position, and
moving together the shaft, the first gate, and the second gate vertically downward to an open gate position;
wherein to seal the first gate or to seal the second gate, the method comprises:
moving together the shaft, the first gate, and the second gate vertically upward from the open gate position prior to tilting, and
wherein both the first gate and the second gate are open in the open gate position.

4. The method of claim 1, comprising:
receiving, by a controller, a position trajectory for the shaft, the first gate, and the second gate;
receiving, by the controller, a position measurement from a continuous position sensor that continuously determines the position of the shaft, the first gate, and the second gate;
generating, by the controller, a control signal based on the position trajectory, the position measurement, and the actuator coupled to the shaft;
transmitting, by the controller, the control signal to the tilting mechanism; and
causing, by the controller, operation of the actuator.

5. A dual gate system, comprising:
a first gate configured to form a first seal against a first slot on a first side of the dual gate system that couples to a first chamber of an electronics device processing system;
a second gate configured to form a second seal against a second slot on a second side of the dual gate system that couples to a second chamber of the electronics device processing system, wherein the second side is opposite the first side;
a first cam follower track;
a second cam follower track;
a cam follower track switch comprising a laterally moveable guide;
a shaft coupled to the first gate, to the second gate, and to an actuator configured to control motion of the shaft along the first cam follower track or the second cam follower track, wherein motion of the shaft is laterally switchable between the first cam follower track or the second cam follower track via the cam follower track switch, wherein the first gate is coupled to a first side of the shaft, and wherein the second gate is coupled to a second side of the shaft;
wherein the first cam follower track is configured to:
seal the first gate to the first slot by tilting together, about a pivot point, the shaft, the first gate, and the second gate to a first sealed gate position where the first gate is compressed against the first side of the dual gate system, wherein the second cam follower track is configured to:
seal the second gate to the second slot by tilting together, about the pivot point, the shaft, the first gate, and the second gate to a second sealed gate position where the second gate is compressed against the second side of the dual gate system, and
wherein the actuator is further configured to:
control at least one of a velocity or a force of the shaft, the first gate, and the second gate.

6. The dual gate system of claim 5, wherein:
at least a portion of the first side to which the first gate makes contact is at a first angle to vertical such that the first gate orthogonally contacts the portion of the first side upon tilting to the first sealed gate position to seal the first slot; and
at least a portion of the second side to which the second gate makes contact is at a second angle to vertical such that the second gate orthogonally contacts the portion of the second side upon tilting to the second sealed gate position to seal the second slot.

7. The dual gate system of claim 6, wherein the first angle is about 1° to about 20 to vertical in the first direction, and wherein the second angle is about 1° to about 20 to vertical in the second direction.

8. The dual gate system of claim 5, wherein the shaft is further coupled to a vertical actuator configured to move the shaft, the first gate and the second gate vertically,
wherein the vertical actuator is configured to:
move together the shaft, the first gate, and the second gate vertically downward to an open gate position, and
move together the shaft, the first gate, and the second gate vertically upward from an open gate position prior to tilting to seal the first gate or to seal the second gate, and
wherein both the first gate and the second gate are open in the open gate position.

9. The dual gate system of claim 5, wherein the first gate and the second gate are both removable from the shaft.

10. A dual gate system comprising:
a first gate configured to form a first seal against a first slot on a first side of the dual gate system that couples to a first chamber of an electronics device processing system;
a second gate configured to form a second seal against a second slot on a second side of the dual gate system that couples to a second chamber of the electronics device processing system, wherein the second side is opposite the first side;
a shaft coupled to the first gate, to the second gate, and to a sealing mechanism, wherein the first gate is coupled to a first side of the shaft, and wherein the second gate is coupled to a second side of the shaft;
wherein the sealing mechanism comprises:
a first cam follower track configured to seal the first gate to the first slot by moving the shaft, the first gate, and the second gate along the first cam follower track to a first sealed gate position;
a second cam follower track configured to seal the second gate to the second slot by moving the shaft, the first gate, and the second gate along the second cam follower track to a second sealed gate position;
a cam follower track switch comprising a laterally moveable guide, wherein the cam follower track switch is configured to laterally switch motion of the shaft, the first gate, and the second gate between the first cam follower track and the second cam follower track; and
a controller configured to control at least one of a velocity or a force of the shaft, the first gate, and the second gate.

11. The dual gate system of claim 10, wherein the cam follower track switch comprises a pneumatic cylinder or an electromagnetic solenoid.

12. A method for operating the dual gate system of claim 10, comprising:
controlling an actuator to move together, along the first cam follower track and in a first direction, at a controlled velocity and/or force, the shaft, the first gate, and the second gate, to a first sealed gate position;
controlling the actuator to move together, along the second cam follower track and in a second direction, at the controlled velocity and/or force, the shaft, the first gate, and the second gate, to a second sealed gate position; and
controlling the cam follower track switch to switch between the first cam follower track and the second cam follower track.

* * * * *